United States Patent
Nishihori et al.

(10) Patent No.: US 6,936,870 B2
(45) Date of Patent: Aug. 30, 2005

(54) HETEROJUNCTION TYPE COMPOUND SEMICONDUCTOR FIELD EFFECT TRANSISTOR AND ITS MANUFACTURING METHOD

(75) Inventors: Kazuya Nishihori, Tokyo (JP); Masanori Ochi, Yokohama (JP); Takao Noda, Yokohama (JP); Yoshitomo Sagae, Yokohoma (JP); Kenji Hommyo, Yamato (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 7 days.

(21) Appl. No.: 10/730,098

(22) Filed: Dec. 9, 2003

(65) Prior Publication Data

US 2004/0164317 A1 Aug. 26, 2004

(30) Foreign Application Priority Data

Dec. 10, 2002 (JP) ..................................... 2002-358337

(51) Int. Cl.[7] ......................................... H01L 31/0328
(52) U.S. Cl. ...................................... 257/194; 257/192
(58) Field of Search ........................................... 257/194

(56) References Cited

U.S. PATENT DOCUMENTS

| 5,504,353 | A | 4/1996 | Kuzuhara |
| 6,534,790 | B2 * | 3/2003 | Kato et al. ..................... 257/76 |
| 6,624,440 | B2 * | 9/2003 | Bito et al. ..................... 257/20 |

FOREIGN PATENT DOCUMENTS

JP        7-335867       12/1995

* cited by examiner

*Primary Examiner*—Douglas A. Wille
(74) *Attorney, Agent, or Firm*—Oblon, Spivak, McClelland, Maier & Neustadt, P.C.

(57) ABSTRACT

A heterojunction type compound semiconductor field effect transistor includes a channel layer, a first electron supply layer, an electric field strength reducing layer, a first contact layer, a recess stopper layer, and a second contact layer sequentially stacked on a compound semiconductor substrate. This transistor has a double recess structure. The first contact layer is composed of GaAs or InGaAs doped with n type impurities with a high electron mobility. The electric field strength reducing layer is composed of intrinsic InGaP.

12 Claims, 9 Drawing Sheets

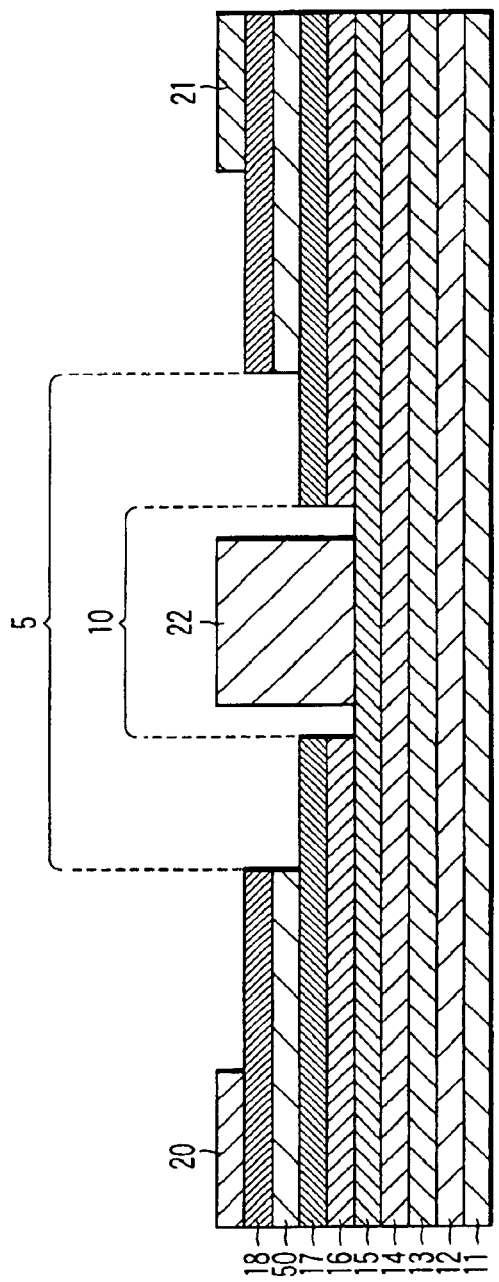
F I G. 17
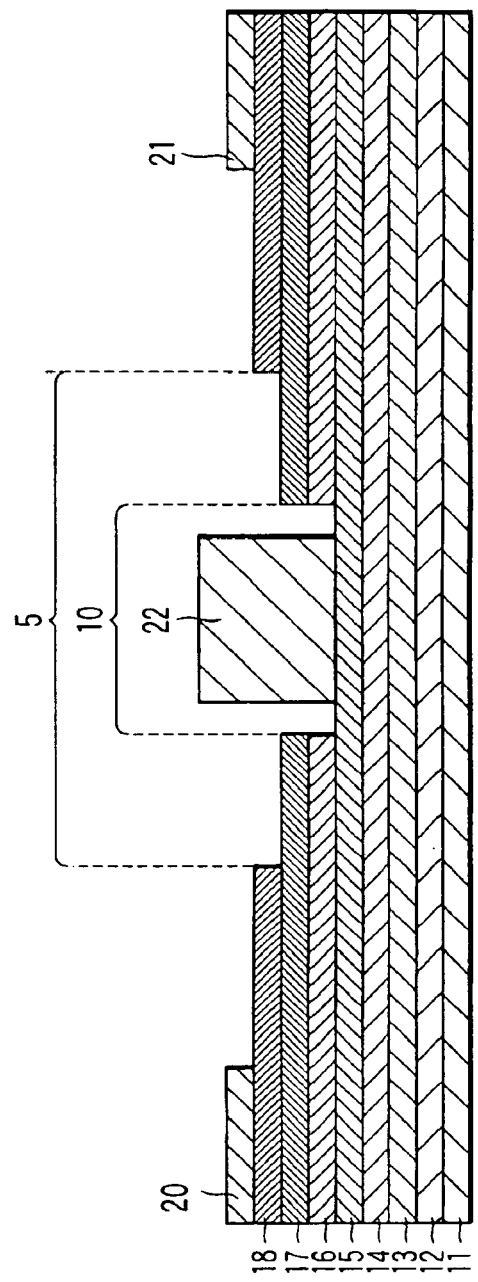
F I G. 18

US 6,936,870 B2

HETEROJUNCTION TYPE COMPOUND SEMICONDUCTOR FIELD EFFECT TRANSISTOR AND ITS MANUFACTURING METHOD

CROSS-REFERENCE TO RELATED APPLICATIONS

This application is based upon and claims the benefit of priority from the prior Japanese Patent Application No. 2002-358337, filed Dec. 10, 2002, the entire contents of which are incorporated herein by reference.

BACKGROUND OF THE INVENTION

1. Field of the Invention

The present invention relates to a semiconductor device, for example, heterojunction type compound semiconductor field effect transistor and its manufacturing method.

2. Description of the Related Art

In recent years, much attention has been paid to high-frequency compound semiconductor field effect transistors utilizing heterojunctions. These high-frequency field effect transistors are produced by stacking and processing compound semiconductor layers on a compound semiconductor substrate made of GaAs or the like. They are applied to high-power amplifiers, switches, low-noise amplifiers, and the like.

In particular, if the high-frequency field effect transistor is applied to a high-power amplifier, it must have a high withstanding voltage and offer a low parasitic resistance. The field effect transistor that must have a high withstanding voltage and offer a low parasitic resistance often employs a structure called "double recess". The double recess structure is a technique by which a contact layer is formed of a two-stage recess in order to ensure a sufficient withstanding voltage while reducing the parasitic resistance. In the double recess structure, the depths of a first recess opening (wide recess opening) and a second recess opening (narrow recess opening) determine the characteristics of the field effect transistor such as its maximum drain current and mutual conductance. Accordingly, when a two-stage recess is formed, it is important to properly control the depths of the first and second recess openings in order to obtain a high yield. Thus, a recess etching process must be very accurate. Further, it is necessary that the recess etching process does not cause a substrate damage that may degrade the characteristics of the transistor. For example, Jpn. Pat. Appln. KOKAI Publication No. 7-335867 discloses a wet etching method utilizing differences in etching speed among materials.

FIG. 1 shows the sectional structure of a conventional heterojunction type field effect transistor. This field effect transistor comprises a semi-insulating GaAs substrate 111 and a buffer layer 112, an electron supply underlayer 113 composed of AlGaAs doped with n type impurities, a semiconductor channel layer 114 composed of undoped GaAs or InGaAs, an electron supply layer 115 composed of AlGaGs doped with n type impurities, a contact underlayer 116 composed of n-InGaP doped with n type impurities, and a contact overlayer 117 composed of GaAs doped with n type impurities, all the layers being sequentially stacked on the substrate 111. A wide recess opening is formed so as to penetrate the contact overlayer 117. A narrow recess opening 132 is formed inside the wide recess opening so as to penetrate the contact underlayer 116. A gate electrode 122 is formed on a surface of the electron supply layer 115 exposed from the bottom of the narrow recess opening. A source electrode 120 and a drain electrode 121 are formed on a surface of the contact overlayer 117 so that the wide recess opening is sandwiched between them.

In the prior art, to accurately form such a double recess structure, an etching operation is performed on the basis of a marked difference in selectivity between etchants used for recess etching, i.e. whether each etchant selectively etches the material InGaP or the material GaAs or InGaAs. For example, an $H_3PO_4$ (phosphoric acid)-based etchant etches InGaAS or GaAs but does not substantially etch InGaP. On the other hand, an HCL (hydrochroic acid)-based etchant does not substantially InGaAS or GaAs, but significantly etches InGaP. That is, when the GaAs contact overlayer 117 is etched by first recess etching using an $H_3PO_4$-based etchant, the etching substantially stops at the surface of the GaAs contact overlayer 117. Then, when the InGaP contact underlayer 116 is etched by second recess etching using an HCl-based etchant, the etching substantially stops at the surface of the AlGaAs electron supply layer 115, formed under the InGaP contact underlayer 116. Thus, the first recess etching and second recess etching are controlled.

In the conventional heterojunction type compound semiconductor field effect transistor, electrons supplied by the source electrode 120 flow through the contact over layer 117, composed of $n^+$-GaAs and offering low resistance, and then through the n-InGaP contact underlayer. The electrons then flow through the channel layer 114, again through the n-InGaP underlayer 116, and through the low-resistance contact overlayer 117 into the drain electrode 121.

However, InGaP, constituting the contact underlayer, has a lower electron mobility than GaAs and InGaAs. For example, the mobility of n-GaAs is 1,700 $cm^2V^{-1}s_{-1}$ at a concentration of $5 \times 10^{18}$ $cm^{-3}$, whereas the mobility of n-InGaP is 800 $cm^2V^{-1}s_{-1}$ at a concentration of $2 \times 10^{18}$ $cm^{-3}$. To exhibit an excellent ohmic characteristic, the $n^+$-GaAs contact overlayer 117, which contacts directly with the source electrode 120 and the drain electrode 121, is doped with a high concentration of n type impurities so as to offer a low resistance. Thus, the resistance value of the contact underlayer 116 significantly affects parasitic resistance such as the source resistance of the transistor.

In the above described configuration, electrons must flow through the n-InGaP contact underlayer 116, having a low electron mobility. This disadvantageously increases the parasitic resistance of the transistor. An increase in the parasitic resistance of the transistor reduces the mutual conductance or maximum drain current of the transistor. If this transistor is applied to a high-frequency power amplifier, its gain may decrease. If the transistor is applied to a high-frequency switch, its insertion loss may increase.

BRIEF SUMMARY OF THE INVENTION

According to an aspect of the present invention, a heterojunction type compound semiconductor field effect transistor comprises a channel layer provided on a compound semiconductor substrate and composed of intrinsic GaAs or InGaAs, a first electron supply layer provided on the channel layer and composed of AlGaAs doped with n type impurities, an electric field strength reducing layer provided on the first electron supply layer and composed of intrinsic InGaP, a first contact layer provided on the electric field strength reducing layer and composed of GaAs or InGaAs doped with n type impurities, a recess stopper layer provided on the first contact layer and composed of intrinsic InGaP, a second contact layer provided on the recess stopper layer and composed of GaAs doped with n type impurities of a concentration higher than that of the first contact layer, a wide recess opening formed to penetrate the second contact layer so as to expose a surface of the recess stopper layer, a narrow recess opening formed in the wide recess opening to penetrate surfaces of the recess stopper layer, the first contact layer, and the electric field strength reducing layer so as to expose the surface of the first electron supply layer, a gate electrode provided on the surface of the first electron supply layer exposed from a bottom of the narrow recess opening, and a source electrode and a drain electrode provided on the second contact layer outside the wide recess opening so that the wide recess opening is sandwiched between the source electrode and the drain electrode.

According to another aspect of the present invention, a manufacturing method for a heterojunction type compound semiconductor field effect transistor comprises forming a channel layer composed of intrinsic GaAs or InGaAs on a compound semiconductor substrate, forming a first electron supply layer composed of AlGaAs on the channel layer, forming an electric field strength reducing layer composed of intrinsic InGaP on the electron supply layer, forming a first contact layer composed of GaAs or InGaAs doped with n type impurities, on the electric field strength reducing layer, forming a recess stopper layer composed of intrinsic InGaP, on the first contact layer, forming, on the recess stopper layer, a second contact layer composed of GaAs doped with n type impurities of a concentration higher than that of the first contact layer, wet-etching the second contact layer to form a wide recess opening penetrating the second contact layer using the recess stopper layer as a stopper, forming a source electrode and a drain electrode on the second contact layer outside the wide recess opening so that the wide recess opening is sandwiched between the source electrode and the drain electrode, wet-etching the first contact layer in the wide recess opening using the electric field strength reducing layer as a stopper, wet-etching the electric field strength reducing layer in the wide recess opening to form a narrow recess opening penetrating the recess stopper layer, the first contact layer, and the electric field strength reducing layer using the first electron supply layer as a stopper, and forming a gate electrode on a surface of the first electron supply layer exposed from a bottom of the narrow recess opening.

BRIEF DESCRIPTION OF THE SEVERAL VIEWS OF THE DRAWING

FIG. 17 is a sectional view of the structure of a heterojunction type compound semiconductor field effect transistor according to a second embodiment of the present invention;

FIG. 18 is a sectional view of the structure of a variation of the heterojunction type compound semiconductor field effect transistors according to the first and second embodiments of the present invention;

DETAILED DESCRIPTION OF THE INVENTION

Figure 1:
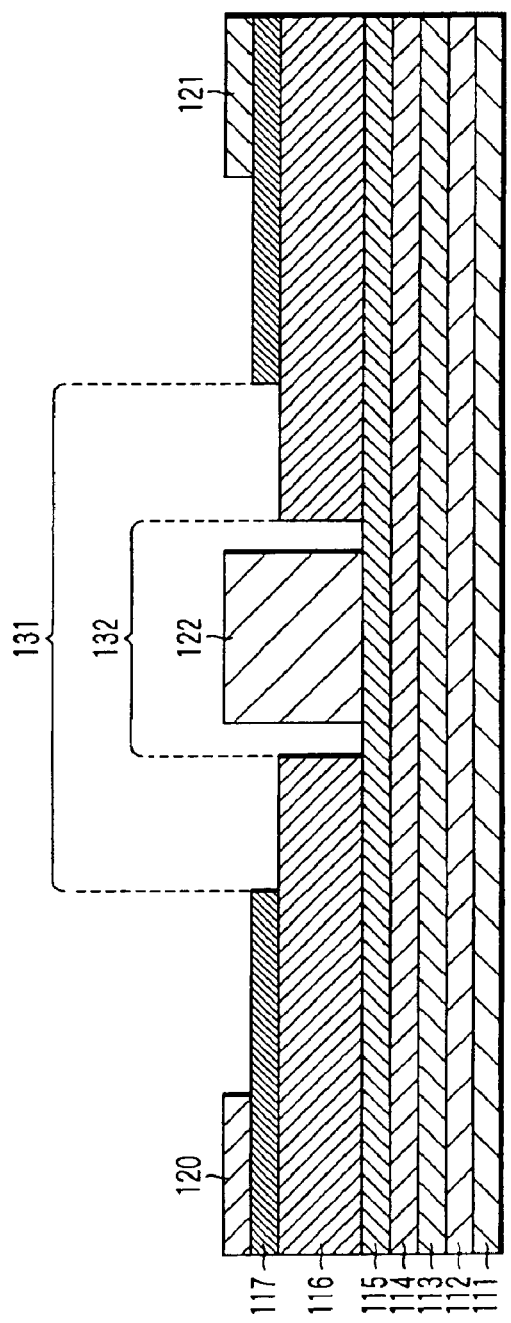
FIG. 1 is a sectional view of the structure of a conventional heterojunction type compound semiconductor field effect transistor.

Embodiments of the present invention will be described below with reference to the drawings. In this description, common parts are denoted by common reference numerals throughout the drawings.

[First Embodiment]

Figure 2:
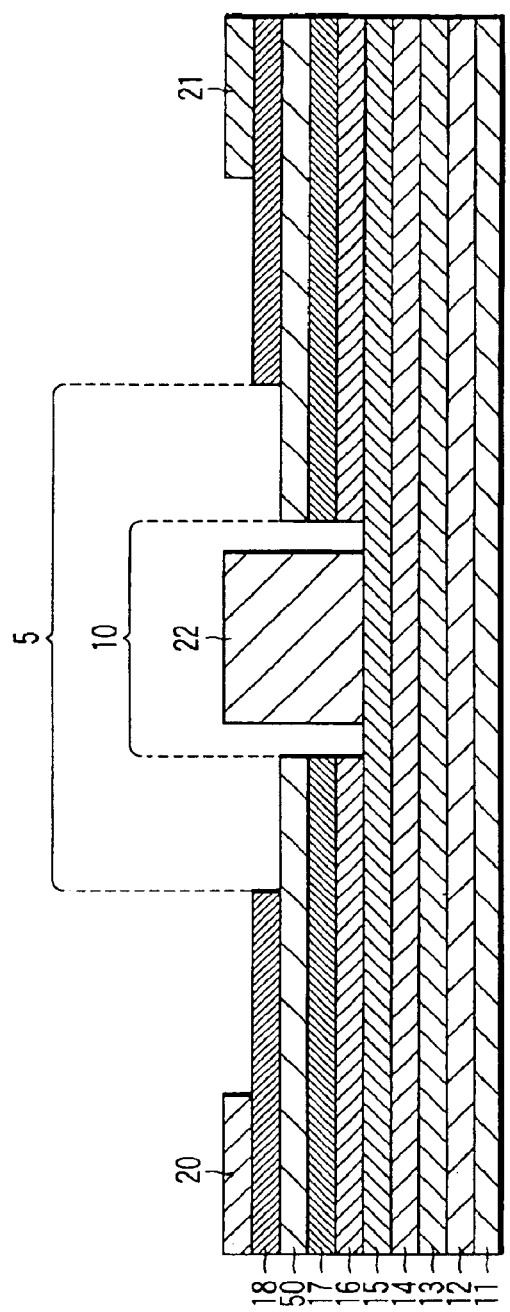
FIG. 2 is a sectional view of the structure of a heterojunction type compound semiconductor field effect transistor according to a first embodiment of the present invention.

FIG. 2 is a sectional view of the structure of a heterojunction type compound semiconductor field effect transistor according to a first embodiment of the present invention. As shown in FIG. 2, an undoped GaAs layer is stacked on a semi-insulating GaAs substrate 11 as a buffer layer 12. Furthermore, an n-$Al_{0.2}Ga_{0.8}As$ layer is stacked on the buffer layer 12 as a lower electron supply layer 13. An i-$Al_{0.2}Ga_{0.8}As$ layer is formed on the electron supply layer 13 as a lower spacer layer (not shown). An i-$In_{0.15}Ga_{0.85}As$ layer is formed on the lower spacer layer as a channel layer 14. An i-$Al_{0.2}Ga_{0.8}As$ layer is formed on the channel layer 14 as an upper spacer layer (not shown). An n-$Al_{0.2}Ga_{0.8}As$ layer is formed on the upper spacer layer as an upper electro supply layer 15. On the electro supply layer 15, an i-$In_{0.48}Ga_{0.52}P$ layer as an electric field strength reducing layer 16, an n-GaAs layer as a contact underlayer 17 (first contact layer), and a low-resistance n$^+$-GaAs layer as a contact overlayer 18 (second contact layer) are sequentially stacked. An i-$In_{0.49}Ga_{0.51}P$ layer is stacked on the contact underlayer 17 as a recess stopper layer 50. A low-resistance n$^+$-GaAs film is stacked on the recess stop layer 50 as a contact overlayer 18. A source electrode 20 and a drain electrode 21 each composed of AuGe/Ni/Au are formed on a surface of the contact overlayer 18 so as to sandwich a wide recess opening 5 between them. The wide recess opening 5 is formed in the contact overlayer 18 so as to penetrate this layer 18. A narrow recess opening 10 narrower than the wide recess opening is formed inside the wide recess opening so as to penetrate the recess stopper layer 50, the contact underlayer 17, and the electric field strength reducing layer 16. A gate electrode 22 composed of, for example, Al is formed on a surface of the electron supply layer 15 exposed from the bottom of the narrow recess opening 10.

As described above, in the field effect transistor according to the first embodiment, the contact underlayer 17 in which the narrow recess opening 10 is formed contains GaAs doped with n type impurities. The contact overlayer 18 in which the wide recess opening 5 is formed contains GaAs doped with a high concentration of n type impurities to reduce resistance. The electric field strength reducing layer 16 and the recess stopper 50 layer are formed of intrinsic InGaP.

Now, description will be given of a field effect transistor according to the present embodiment.

The semi-insulating GaAs substrate 11 and the source electrode 20 are grounded, and a voltage higher than a threshold voltage is applied to the gate electrode 22. Then, a channel is formed in the channel layer 14 (i-$In_{0.15}Ga_{0.85}As$ layer). In this state, when a voltage is applied to the drain electrode 21, electrons supplied by the source electrode 20 flow through the low-resistance contact overlayer 18. The electrons flow mainly through the contact underlayer 17 to the channel layer 14. The electrons then flow mainly through the contact underlayer 17 again and through the contact overlayer 18 into the drain electrode 21. In this manner, the heterojunction type compound semiconductor field effect transistor completes a switching operation.

In the field effect transistor according to the first embodiment, the contact underlayer 17 is formed of GaAs, having a higher mobility than InGap, offers a sharply reduced resistance. Accordingly, the semiconductor field effect transistor according to the first embodiment offers a low on resistance and has a large maximum drain current and a large mutual conductance.

Furthermore, the electric field strength reducing layer 16 is intentionally not doped with any impurities. That is, the electric field strength reducing layer 16 is intrinsic. Thus, the electric field strength reducing layer 16 can relax the concentration of electric fields that may occur near an end of the gate electrode 22. Moreover, electrons flow through the contact underlayer 17 formed of GaAs, having a relatively high mobility, as described above. This is effective in improving a withstanding voltage without increasing parasitic resistance.

Now, with reference to FIGS. 3 to 16, description will be given of a manufacturing method for the heterojunction type field effect transistor shown in FIG. 2.

Figure 3:
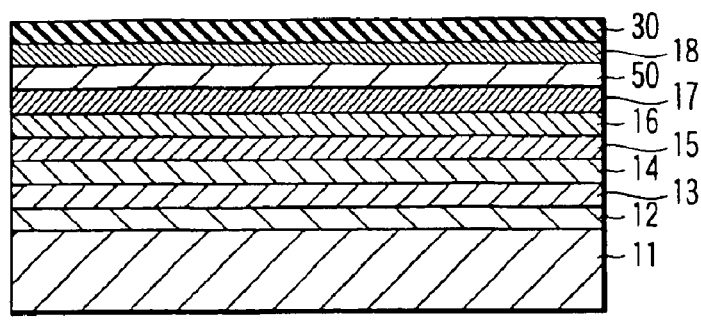
FIG. 3 is a sectional view of the structure of the heterojunction type compound semiconductor field effect transistor according to the first embodiment of the present invention, showing a first manufacturing step.

First, for example, an MOCVD method or an MBE method is used to form the buffer layer composed of a superlattice structure of GaAs or GaAs/$Al_{0.2}Ga_{0.8}As$, on the semi-insulating GaAs substrate 11 to a thickness of, for example, 500 nm on the basis of epitaxial growth. Subsequently, an n-$Al_{0.2}Ga_{0.8}As$ layer doped with about $2\times10^{18}$ cm$^{-3}$ of Si is formed on the buffer layer to a thickness of, for example, 5 nm as the lower electron supply layer 13, on the basis of epitaxial growth. Then, an undoped i-$Al_{0.2}Ga_{0.8}As$ layer is formed on the electron supply layer 13 to a thickness of, for example, 5 nm as the lower spacer layer (not shown) on the basis of epitaxial growth. Subsequently, an undoped $In_{0.15}Ga_{0.85}As$ layer is formed on the lower spacer layer to a thickness of, for example, 15 nm as the channel layer 14 on the basis of epitaxial growth. Then, an undoped i-$Al_{0.2}Ga_{0.8}As$ layer is formed to a thickness of, for example, 5 nm as the upper spacer layer (not shown) on the basis of epitaxial growth. Subsequently, on the upper spacer layer, an n-$Al_{0.2}Ga_{0.8}As$ layer doped with about $1\times10^{19}$ cm$^{-3}$ of Si is formed to a thickness of, for example, 5 nm as the upper electron supply layer 15 and an n-$Al_{0.2}Ga_{0.8}As$ layer doped with about $7\times10^{17}$ cm$^{-3}$ of Si is formed to a thickness of, for example, 7 nm, on the basis of epitaxial growth. Subsequently, an undoped i-$In_{0.48}Ga_{0.52}P$ layer is formed to a thickness of, for example, 5 nm as the electric field strength reducing layer 16. Then, an n-As layer doped with about $4\times10^{18}$ cm$^{-3}$ of Si is formed on the electric field strength reducing layer 16 to a thickness of, for example, 20 nm as the contact underlayer 17 on the basis of epitaxial growth. Then, an i-$In_{0.49}Ga_{0.51}P$ layer is formed on the contact underlayer 17 to a thickness of, for example, 3 nm as the recess stopper layer 50 on the basis of epitaxial growth. Then, an n+-GaAs film doped with about 5e18 cm$^{-3}$ of Si is formed on the recess stopper layer 50 to a thickness of, for example, 100 nm as the contact overlayer 18 on the basis of epitaxial growth. An insulating film 30 composed of SiO$_2$ is formed on the contact overlayer 18 (FIG. 3).

Here, the n-Al$_{0.2}$Ga$_{0.8}$As layer, formed as a part of the electron supply layer 15 and doped with about 7×10$^{17}$ cm$^{-3}$ of Si, is sometimes called a shot key layer and is used to improve a shot key gate withstanding voltage.

Figure 4:
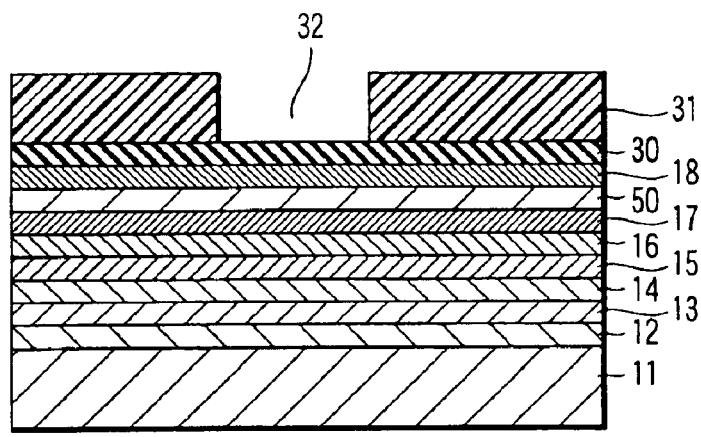
FIG. 4 is a sectional view of the structure of the heterojunction type compound semiconductor field effect transistor according to the first embodiment of the present invention, showing a second manufacturing step.

Then, to form the wide recess opening on the insulating film 30, a photo resist 31 is applied and subjected to processes such as exposure and development. A pattern 32 is then formed in the photo resist 31 to form the wire recess opening (FIG. 4).

Figure 5:
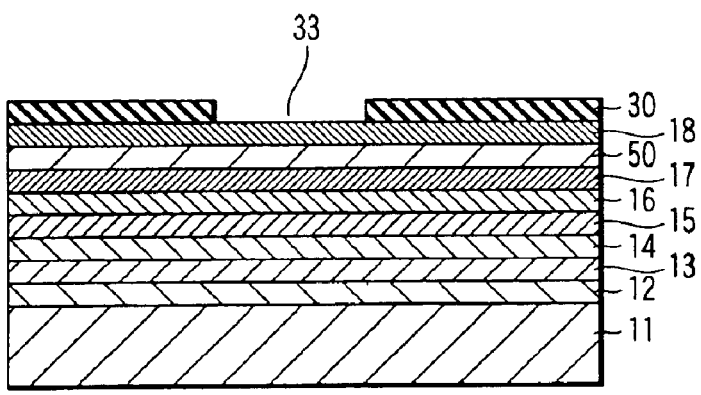
FIG. 5 is a sectional view of the structure of the heterojunction type compound semiconductor field effect transistor according to the first embodiment of the present invention, showing a third manufacturing step.

Then, the photo resist pattern 32 is used as a mask to etch the insulating film 30 on the basis of, for example, an RIE (Reactive Ion Etching) method. A pattern 33 used to form the wide recess opening is thus formed in the insulating film 30. Subsequently, the photo resist pattern 32 is released (FIG. 5).

Figure 6:
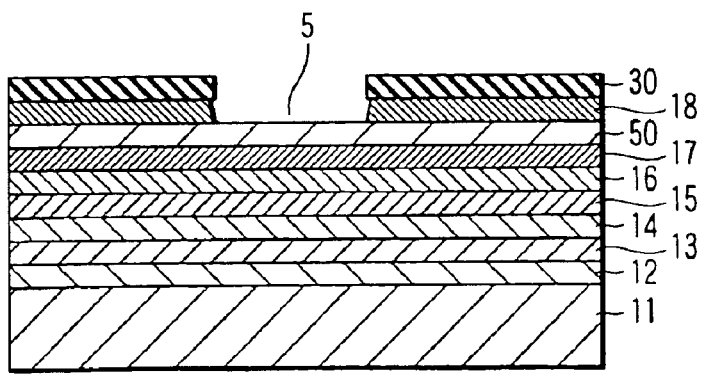
FIG. 6 is a sectional view of the structure of the heterojunction type compound semiconductor field effect transistor according to the first embodiment of the present invention, showing a fourth manufacturing step.

Then, the patterned insulating film 30 is used as a mask to wet-etch and penetrate the n type contact overlayer 1B using an H$_3$PO$_4$-based etchant composed of, for example, H$_3$PO$_4$, H$_2$O$_2$, and H$_2$O in the ratio of 3:1:50. Thus, the wide recess opening 5 is formed. At this time, the recess stopper layer 50 is used as a stopper for the H$_3$PO$_4$-based etchant (FIG. 6).

Figure 7:
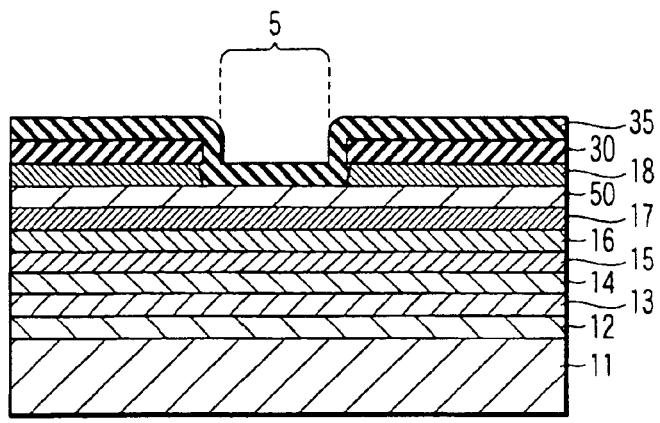
FIG. 7 is a sectional view of the structure of the heterojunction type compound semiconductor field effect transistor according to the first embodiment of the present invention, showing a fifth manufacturing step.

Then, to form the narrow recess opening 10 narrower than the wide recess opening 5, inside the wide recess opening 5, an insulating film 35 composed of SiO$_2$ is formed all over the top surface of the structure (FIG. 7).

Figure 8:
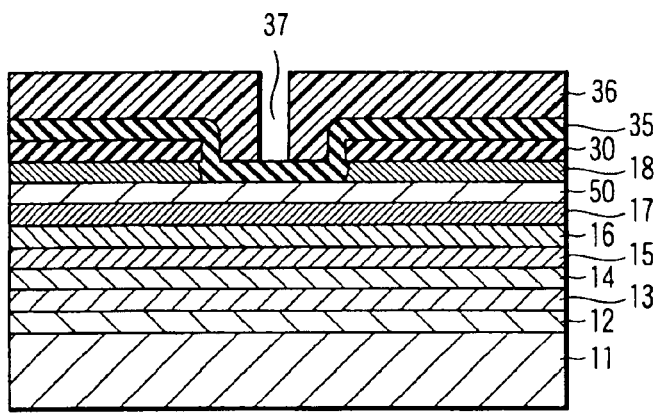
FIG. 8 is a sectional view of the structure of the heterojunction type compound semiconductor field effect transistor according to the first embodiment of the present invention, showing a sixth manufacturing step.
Figure 9:
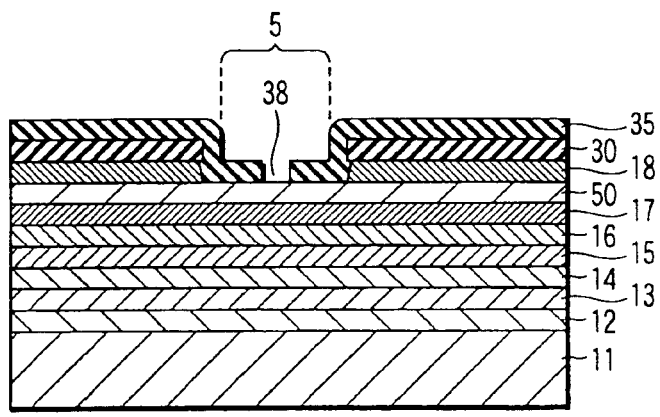
FIG. 9 is a sectional view of the structure of the heterojunction type compound semiconductor field effect transistor according to the first embodiment of the present invention, showing a seventh manufacturing step.

Then, a photo resist 36 is applied and processes such as exposure and development are executed to form an opening pattern 37. Then, the photo resist 36 is used as a mask to etch the insulating film 35 on the basis of the RIE method. A pattern 38 used to form the narrow recess opening is thus formed on the insulating film 35. Subsequently, the photo resist 36 is released (FIGS. 8 and 9).

Then, a lift-off method is used to form the source electrode 20 and drain electrode 21 each composed of AuGe/Ni/Au are formed on the surface of the contact overlayer 18 so as to sandwich the wide recess opening 5 between them.

Figure 10:
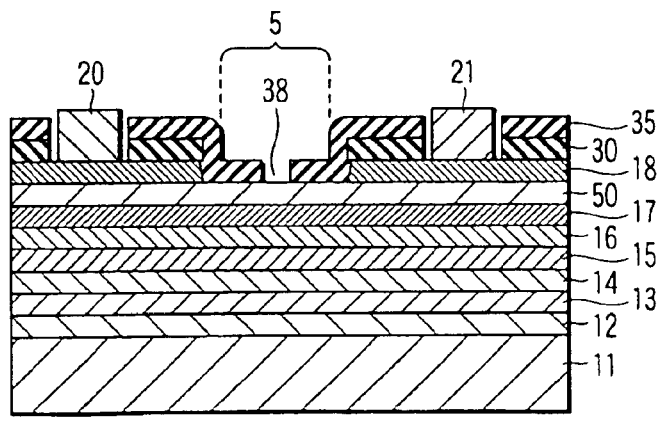
FIG. 10 is a sectional view of the structure of the heterojunction type compound semiconductor field effect transistor according to the first embodiment of the present invention, showing an eighth manufacturing step.

Alternatively, the source electrode 20 and the drain electrode 21 may be formed after the formation of the gate electrode 22, described below (FIG. 10).

Figure 11:
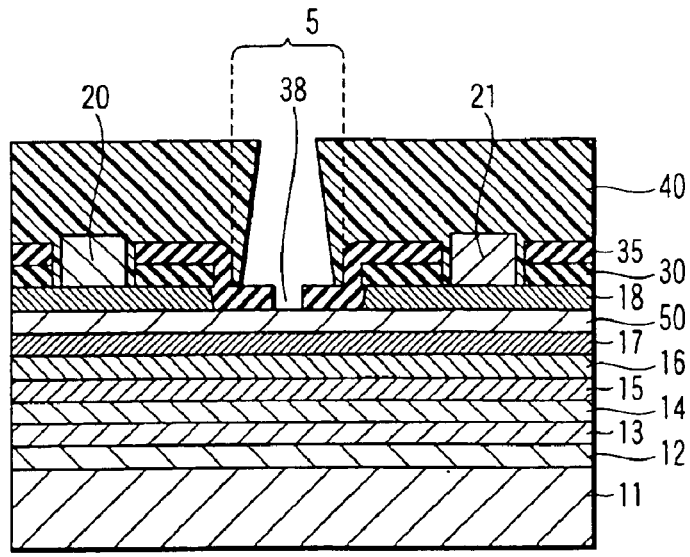
FIG. 11 is a sectional view of the structure of the heterojunction type compound semiconductor field effect transistor according to the first embodiment of the present invention, showing a ninth manufacturing step.

Subsequently, to form the gate electrode 22, a photo resist pattern 40 is formed on the insulating film 35 (FIG. 11).

Figure 12:
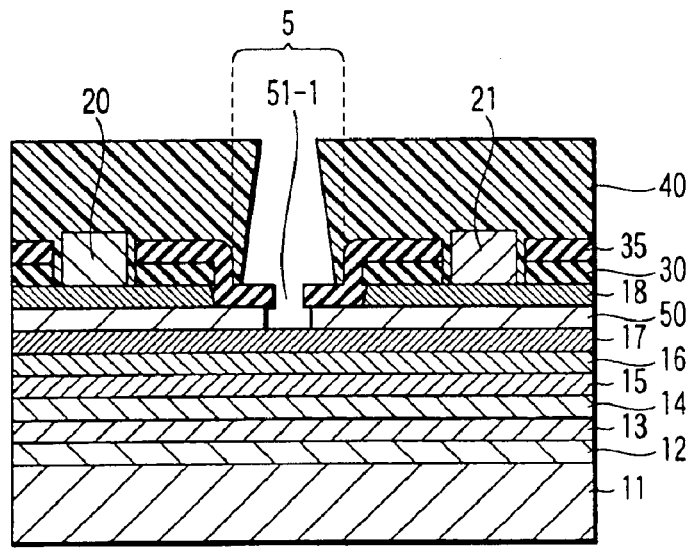
FIG. 12 is a sectional view of the structure of the heterojunction type compound semiconductor field effect transistor according to the first embodiment of the present invention, showing a tenth manufacturing step.

Then, using, as a mask, the insulating film 35 on which the pattern used to form the narrow recess opening 10 is formed, an opening 51-1 is formed using an etchant composed of, for example, HCl, so as to penetrate the recess stopper layer 50 and reach a surface of the contact underlayer 17. At this time, HCl does not substantially etch the contact underlayer 17, composed of n-GaAs. Accordingly, once the surface of the contact underlayer 17 is exposed, the recess etching is substantially stopped (FIG. 12). That is, the contact underlayer 17 can be used as a stopper when the recess stopper layer 50 is etched.

Figure 13:
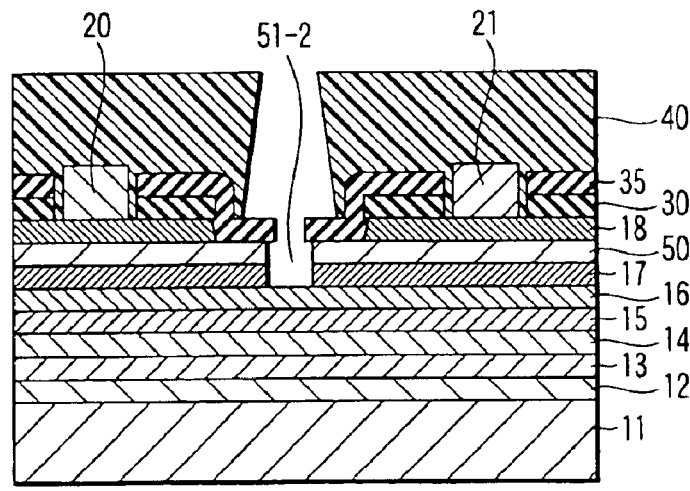
FIG. 13 is a sectional view of the structure of the heterojunction type compound semiconductor field effect transistor according to the first embodiment of the present invention, showing an eleventh manufacturing step.

Then, an H$_3$PO$_4$-based etchant composed of, for example, H$_3$PO$_4$, H$_2$O$_2$, and H$_2$O in the ratio of 3:1:50 is used to form an opening 51-2 penetrating the contact underlayer 17 and reaching a surface of the electric field strength reducing layer 16. At this time, the H$_3$PO$_4$-based etchant does not substantially etch InGaP. Accordingly, once the surface of the i-In$_{0.48}$Ga$_{0.52}$P layer, the electric field strength reducing layer 16, is exposed, the recess etching is substantially stopped (FIG. 13). That is, the electric field strength reducing layer 16 can be used as a stopper when the contact underlayer 17 is etched.

Figure 14:
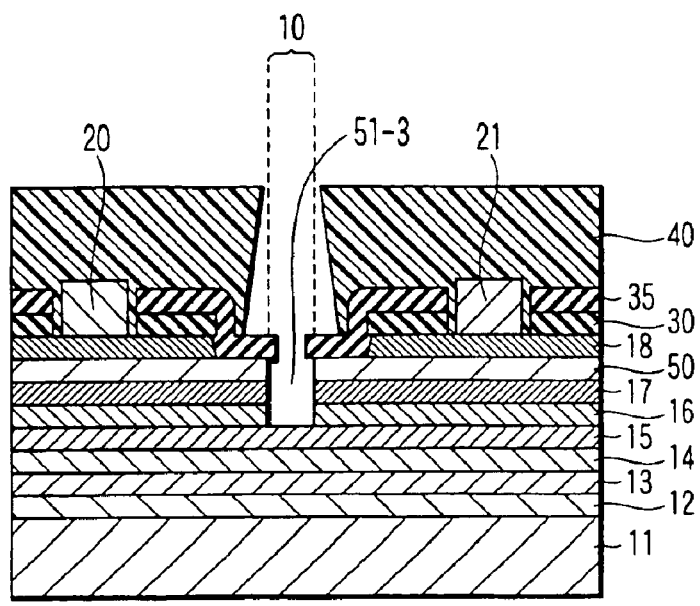
FIG. 14 is a sectional view of the structure of the heterojunction type compound semiconductor field effect transistor according to the first embodiment of the present invention, showing a twelfth manufacturing step.

Subsequently, an etchant composed of, for example, HCl is used to remove the electric field strength reducing layer 16 (i-In$_{0.48}$Ga$_{0.52}$P layer) to form an opening 51-3. At this time, HCl does not substantially etch the contact underlayer 17, composed of n-GaAs. Thus, only the electric field strength reducing layer 16 can be selectively etched. This enables the etching depth to be accurately controlled. Consequently, the desired narrow recess opening 10 can be formed (FIG. 14).

Figure 15:
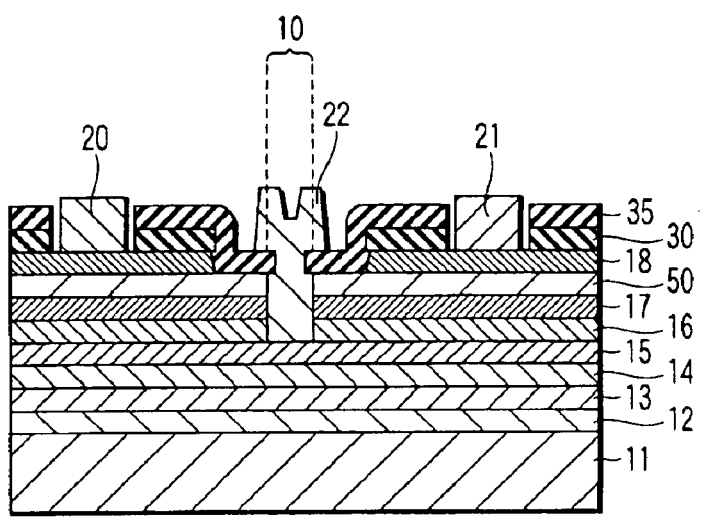
FIG. 15 is a sectional view of the structure of the heterojunction type compound semiconductor field effect transistor according to the first embodiment of the present invention, showing a thirteenth manufacturing step.

Then, the gate electrode 22 composed of, for example, Ti/Pt/Au or Ti/Al or Al is formed on a surface of the upper electron supply layer 15 exposed from the bottom of the narrow recess opening 10, using, for example, a lift-off method. Alternatively, the gate electrode 22 may be formed of a high-melting-point metal. In this case, the high-melting-point metal is formed into a film using a sputtering method. The film is then patterned using reactive ion etching, to form the gate electrode 22. Subsequently, the photo resist pattern 40 is released (FIG. 15).

Figure 16:
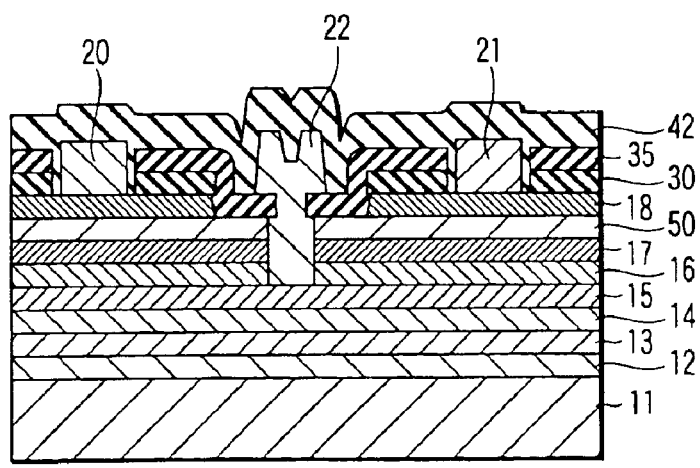
FIG. 16 is a sectional view of the structure of the heterojunction type compound semiconductor field effect transistor according to the first embodiment of the present invention, showing a fourteenth manufacturing step.

Finally, a protective film 42 composed of, for example, SiN is formed all over the surface of the structure to complete a heterojunction type semiconductor field effect transistor (FIG. 16).

In the first embodiment, the intrinsic recess stopper layer 50, composed of InGaP, is interposed between the contact overlayer 18 and the contact underlayer 17. In a recess etching step of forming the wide recess opening 5, the H$_3$PO$_4$-based etchant etches the recess stopper layer 50, composed of InGaP, at a very low etching speed. This etchant can thus selectively remove only the contact overlayer 18, composed only of GaAs. As a result, the etching depth can be accurately controlled.

In a recess etching step of forming the narrow recess opening 10 inside the wide recess opening 5, the electric field strength reducing layer 16, composed of InGaP, and the contact underlayer 17, composed of InGaAs, can be selectively etched. Thus, also in this case, the etching depth can be accurately controlled.

Specifically, an etching step of forming such a recess structure can be accurately controlled. Accordingly, the yield of the heterojunction type field effect transistor according to the present invention is not lower than that of the prior art. Thus, with the heterojunction type compound semiconductor field effect transistor according to the first embodiment of the present invention, it is possible to make use of the advantage of the double recess structure of achieving both high gate withstanding voltage and large maximum drain current while maintaining a high yield. Furthermore, if the heterojunction type compound semiconductor field effect transistor according to the present embodiment is applied to a low-noise amplifier, a linear amplifier, a high-power amplifier, or the like which operates in a microwave or millimeter wave region for which performance such as that described above is required, its performance and yield are expected to be significantly increased.

The recess stopper layer 50, composed of InGaP layer, functions as a stopper for wet etching. However, the electron transmission problem associated with the insertion of the InGaP layer in connection with the intrinsic property of the recess stopper layer 50 is minimized. Furthermore, the recess stopper layer 50 can be made thinner than the contact underlayer 17.

[Second Embodiment]

FIG. 17 is a sectional view of the structure of a heterojunction type compound semiconductor field effect transistor according to a second embodiment of the present invention. In the description below, differences from the first embodiment will be described.

As shown in FIG. 17, the wide recess opening 5 is formed to penetrate the low-resistance $n^+$-GaAs layer of the contact overlayer 18 and the recess stopper layer 50.

The other arrangements and operations of the field effect transistor according to the second embodiment are similar to those of the first embodiment. Thus, their description is omitted.

As an operational effect of the heterojunction type field effect transistor according to the present embodiment, the parasitic resistance can be sharply reduced. This is because as in the case with the first embodiment, the contact underlayer 17 is composed of GaAs, having a high electron mobility than InGaP, and thus has a high electron mobility. Moreover, because of a small parasitic resistance, this transistor offers a low on resistance and has a large maximum drain current and a large mutual conductance.

Furthermore, in the heterojunction type field effect transistor according to the present embodiment, the electric field strength reducing layer 16, composed of InGaP, is intrinsic. This relaxes the concentration of electric fields that may occur near the end of the gate electrode 22. As described above, electrons flow through the contact underlayer 17 formed of GaAs, having a relatively high mobility. It is thus possible to increase the withstanding voltage of the heterojunction type compound semiconductor field effect transistor without increasing the parasitic resistance.

Now, a detailed description will be given of a manufacturing method-for the heterojunction type field effect transistor according to the second embodiment.

First, the same steps as those of the first embodiment are executed until the contact overlayer 18 is formed.

Then, a photo resist pattern used to form the wide recess opening 5 is formed on the contact overlayer 18. This photo resist pattern is used as a mask to etch the insulating film to form a pattern on the insulating film which is used to form the wide recess opening 5. Subsequently, the photo resist pattern is released.

Subsequently, an $H_3PO_4$-based etchant composed of, for example, $H_3PO_4$, $H_2O_2$, and $H_2O$ in the ratio of 3:1:50 is used to form the wide recess opening 5 penetrating the n type contact overlayer 18. At this time, the $H_3PO_4$-based etchant does not substantially etch InGaP. Accordingly, once the surface of the $i-In_{0.49}Ga_{0.51}P$ layer, the recess stopper layer 50, is exposed, the recess etching penetrating the n type contact overlayer 18 is substantially stopped. That is, the recess stopper layer 50 is used as a stopper for etching.

Then, an etchant composed of, for example, an HCl solution is used to remove that area of the recess stopper layer 50 ($i-In_{0.49}Ga_{0.51}P$ layer) which is located at the bottom of the wide recess opening 5. At this time, HCl does not substantially etch the contact underlayer 17, composed of n-GaAs or InGaAs.

Then, to form the narrow recess opening 10 narrower than the wide recess opening 5, inside the wide recess opening 5, an insulating film composed of $SiO_2$ is first formed all over the top surface of the structure. Subsequently, a photo resist opening pattern used to form the narrow recess opening 10 is formed on this insulating film. Then, the photo resist opening pattern is used as a mask to etch the insulating film 35 on the basis of the RIE method.

A pattern used to form the narrow recess opening is thus formed on the insulating film. Subsequently, the photo resist pattern is released.

Then, the liftoff method is used to form the source electrode 20 and drain electrode 21 each composed of AuGe/Ni/Au are formed on the surface of the contact overlayer 18 so as to sandwich the wide recess opening 5 between them. Alternatively, the source electrode 20 and the drain electrode 21 may be formed after the formation of the gate electrode 22, described below.

Subsequently, a photo resist is applied to the insulating film and patterned to form a photo resist pattern. This photo resist pattern and the insulating film are used as a mask to wet-etch the contact underlayer 17 using an $H_3PO_4$-based etchant composed of, for example, $H_3PO_4$, $H_2O_2$, and $H_2O$ in the ratio of 3:1:50. The narrow recess opening 10 is thus formed so as to penetrate the contact underlayer 17. At this time, the $H_3PO_4$-based etchant does not substantially etch InGaP. Accordingly, once the surface of the $i-In_{0.49}Ga_{0.51}P$ layer, the electric field strength reducing layer 16, is exposed, the recess etching penetrating the n type contact underlayer 17 is substantially stopped.

Then, an etchant composed of, for example, an HCl solution is used to remove the electric field strength reducing layer 16 ($i-In_{0.49}Ga_{0.51}P$ layer). At this time, the HCl solution does not substantially etch the $n-Al_{0.2}Ga_{0.8}As$ layer, the upper electron supply layer 15.

Then, the gate electrode 22 composed of, for example, Ti/Pt/Au or Ti/Al or Al is formed on the surface of the upper electron supply layer 15 exposed from the bottom of the narrow recess opening 10, using, for example, the liftoff method. Alternatively, the gate electrode 22 may be formed of a high-melting-point metal. In this case, the high-melting-point metal is formed into a film using the sputtering method. The film is then patterned using reactive ion etching, to form the gate electrode 22.

Finally, a protective film composed of SiN is formed all over the surface of the structure to complete a heterojunction type semiconductor field effect transistor.

As in the case with the first embodiment, in the second embodiment, in the first recess etching for forming the wide recess opening 5, the $H_3PO_4$-based etchant can be used to selectively remove the contact overlayer 18, composed of Gabs, while leaving to the recess stopper layer 50, composed of InGaP, as it is. Consequently, the etching depth can be accurately controlled. Furthermore, in the second recess etching for forming the narrow opening inside the wide recess opening 5, the $H_3PO_4$-based etchant can be used to selectively remove the contact underlayer 17, composed of GaAs or InGaAs, while leaving the electric field strength reducing layer 16, composed of InGaP, as it is. Thus, also in this case, the etching depth can be accurately controlled.

The manufacturing method for the heterojunction type field effect transistor according to the present embodiment does not impair the advantage of the prior art of being able to accurately control etching in the recess structure. Furthermore, this manufacturing method does not reduce the yield. It is thus possible to improve the advantage of the double recess structure of achieving both high gate withstanding voltage and large maximum drain current while maintaining a high yield. Therefore, if the heterojunction type compound semiconductor field effect transistor according to the present embodiment is applied to a low-noise amplifier, a linear amplifier, a high-power amplifier, or the like which operates in a microwave or millimeter wave region for which performance such as that described above is required, its performance and yield are expected to be significantly increased.

Moreover, the heterojunction type compound semiconductor field effect transistor according to the present embodiment solves the problems with the prior art that may occur during a manufacturing process as described below.

For the conventional heterojunction type compound semiconductor field effect transistor shown in FIG. 1, in its manufacturing process, the narrow recess opening 132 is formed while the contact underlayer 116, composed of n-InGaP, is exposed from the bottom surface of the wide recess opening 131. However, in this case, the problems described below may occur.

In forming the narrow recess opening 132, a photo resist pattern is formed after an insulating film composed of an $SiO_2$ or SiN film has been formed on the surface of the semiconductor contact underlayer 116, composed of n-InGaP and exposed from the bottom of the wide recess opening 131. However, a high temperature of 300° C.: or higher is required to form the insulating film. On this occasion, component elements of the contact underlayer 116, composed of n-InGaP, are dissociated to modify the contact underlayer 116, composed of n-InGaP. The contact underlayer 116 composed of the thus modified n-InGaP may not be etched by an etchant composed of an HCl solution. Then, the narrow recess opening 132 cannot be formed.

Moreover, since the fine narrow recess opening 132 is accurately formed, when the insulating film is etched using the RIE method, the surface of the contact underlayer 117, composed of n-InGaP, may be damaged. Consequently, the contact underlayer 116, composed of n-InGaP, is also modified. The contact underlayer 116 composed of the thus modified n-InGaP may not be etched by an etchant composed of an HCl solution. Then, also in this case, the narrow recess opening 132 cannot be formed.

Instead of forming an insulating film composed of an $SiO_2$ or SiN film on the surface of the semiconductor contact underlayer 116, composed of n-InGaP and exposed from the bottom of the wide recess opening 131, a photo resist pattern may be formed directly on the surface of the semiconductor contact underlayer 116, composed of n-InGaP. Also in this case, a thermal process at about 200° C. is required, so that the semiconductor contact underlayer 116, composed of n-InGaP, is not a little modified. The contact underlayer 116 composed of the thus modified n-InGaP may not be etched by an etchant composed of an HCl solution. Then, also in this case, the narrow recess opening 132 cannot be formed.

In contrast, for the heterojunction type compound semiconductor field effect transistor according to the present embodiment, the contact underlayer 17, composed of GaAs or InGaAs is exposed from the bottom of the wide recess opening 5. This prevents the failure to form the narrow recess opening 10 as occurs in the prior art.

As described above, in the manufacturing process, the recess stopper layer 50, composed of an InGaP layer, functions as a stopper for wet etching. This minimizes the electron transmission problem resulting from the use of an InGaP layer. Thus, as in the case with the first embodiment, the recess stopper layer 50 can be made thinner than the contact underlayer 17.

[Variation 1]

In the previously described first and second embodiment, the recess stopper layer 50 is provided between the contact overlayer 18, formed of GaAs, and the contact underlayer 17. However, if the etching operation can be accurately controlled, only the contact overlayer 18 can be selectively removed without providing the recess stopper layer 50, as shown in FIG. 18.

Specifically, as shown in FIG. 18, the wide recess opening 5 is formed to penetrate the contact overlayer 18. The narrow recess opening 10, which is narrower than the wide recess opening 5, is formed inside the wide recess opening 5 so as to penetrate the contact underlayer 17 and the electric field strength reducing layer 16. This heterojunction type compound semiconductor field effect transistor has a double recess structure composed of the wide recess opening 5 and the narrow recess opening 10.

The gate electrode 22, composed of, for example, Al, is formed on the surface of the upper electron supply layer 15 exposed from the bottom of the narrow recess opening 10. The source electrode 20 and drain electrode 21, each composed of, for example, AuCe/Ni/Au, are formed on the contact overlayer 18 so as to sandwich the wide recess opening 5 between them.

As described above, the contact underlayer 17, forming the narrow recess opening 10, contains GaAs doped with n type impurities. The contact overlayer 18, forming the wide recess opening 5, also contains GaAs doped with a higher concentration of n type impurities. Moreover, the electric field strength reducing layer 16 is formed of intrinsic InGaP.

Then, description will be given of a switching operation of the above field effect transistor.

The semi-insulating GaAs substrate 11 and the source electrode 20 are grounded, and a threshold voltage is applied to the gate electrode 22. Then, a channel is formed in the channel layer 14 (i-$In_{0.15}Ga_{0.85}As$ layer) so that electrons can pass through the channel. Then, when a voltage is applied to the drain electrode 21, electrons supplied by the source electrode 20 flow through the low-resistance contact overlayer 18. The electrons flow mainly through the contact underlayer 17 (n-GaAs layer) to the channel layer 14. The electrons then flow mainly through the contact underlayer 17 again and through the contact overlayer 18 into the drain electrode 21.

In this case, in the conventional heterojunction type compound semiconductor field effect transistor shown in FIG. 1, electrons supplied by the source electrode 122 flow through the low-resistance contact overlayer 117. Then, the electrons flow mainly through the contact underlayer 116, composed of n-InGaP, to the semiconductor channel layer 114. The electrons then flow through the contact underlayer 116 again and through the contact overlayer 117 into the drain electrode 121.

In contrast, in this field effect transistor, the contact underlayer 17 is formed of GaAs, having a higher mobility than InGap, offers a sharply reduced resistance compared to the prior art. Accordingly, this field effect transistor offers a low on resistance is and has a large maximum drain current and a large mutual conductance.

Furthermore, the electric field strength reducing layer 16 is intentionally not doped with any impurities. That is, the electric field strength reducing layer 16 is intrinsic. Thus, the electric field strength reducing layer 16 can relax the concentration of electric fields that may occur near the end of the gate electrode 22, compared to the prior art, by which a layer composed of InGaP is intentionally doped with impurities. Moreover, electrons flow through the contact underlayer 17 formed of GaAs, having a relatively high mobility, as described above. This enables the withstanding voltage to be improved without increasing parasitic resistance.

Now, description will be given of a manufacturing method for the heterojunction type field effect transistor according to the present variation.

Basically, this method first executes steps similar to those shown in FIGS. 3 to 10. However, this method differs from the first embodiment in that when the wide recess opening 5 is formed in the contact overlayer 18 in the steps shown in FIGS. 5 and 6, an etching operation must be accurately preformed by using an $H_3PO_4$-based etchant and controlling time, temperature, or the like.

Subsequently, steps such as those shown in FIGS. 7 to 10 are executed to obtain an intermediate structure such as that shown in FIG. 10.

Figure 19:
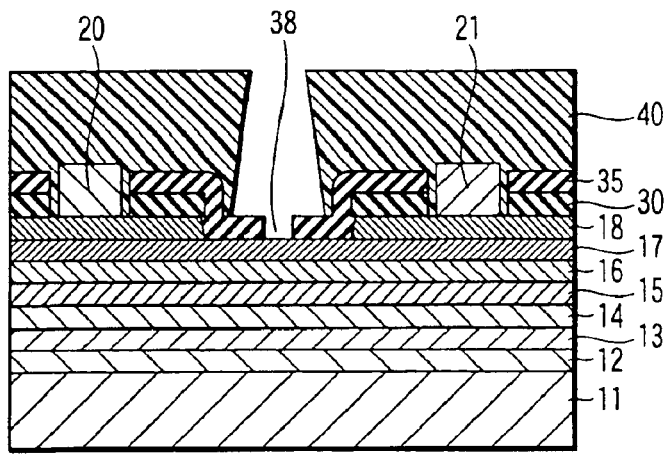
FIG. 19 is a sectional view of the structure of the heterojunction type compound semiconductor field effect transistor shown in FIG. 18, illustrating a first manufacturing step of a manufacturing method for this transistor.
Figure 20:
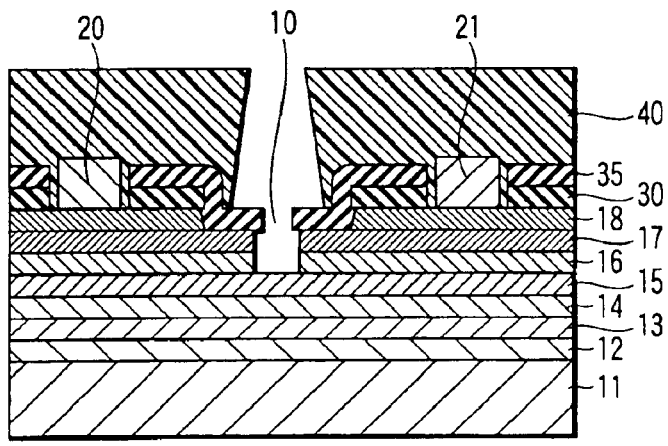
FIG. 20 is a sectional view of the structure of the heterojunction type compound semiconductor field effect transistor shown in FIG. 18, illustrating a second manufacturing step of the manufacturing method for this transistor.
Figure 21:
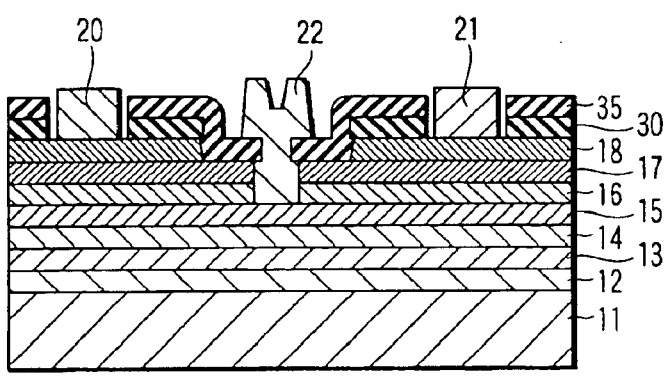
FIG. 21 is a sectional view of the structure of the heterojunction type compound semiconductor field effect transistor shown in FIG. 18, illustrating a third manufacturing step of the manufacturing method for this transistor.

Then, a photo resist is applied to the insulating film 35 and patterned to form the photo resist pattern 40. The photo resist pattern 40 and the insulating film 35 are used as a mask to wet-etch and penetrate the contact underlayer 17 using an $H_3PO_4$-based etchant composed of, for example, $H_3PO_4$, $H_2O_2$, and $H_2O$ in the ratio of 3:1:50. At this time, the $H_3PO_4$-based etchant does not substantially etch InGaP. Accordingly, once the surface of the electric field strength reducing layer 16 (i-$In_{0.49}Ga_{0.51}P$ layer) is exposed, the etching speed decreases sufficiently to substantially stop the etching. Then, an etchant composed of, for example, HCl is used to remove the electric field strength reducing layer 16 (i-$In_{0.48}Ga_{0.52}P$ layer). At this time, HCl does not substantially etch the contact underlayer 17, composed of n-GaAs. Thus, the electric field strength reducing layer 16 can be selectively etched to ensure an accurate etching depth. Therefore, the desired narrow recess opening 10 can be formed (FIGS. 19 and 20).

Then, the gate electrode 22 composed of, for example, Ti/Pt/Au or Ti/Al or Al is formed on the surface of the upper electron supply layer 15 exposed from the bottom of the narrow recess opening 10, using, for example, the liftoff method. Alternatively, the gate electrode 22 may be formed of a high-melting-point metal. In this case, the high-melting-point metal is formed into a film using the sputtering method. The film is then patterned using reactive ion etching, to form the gate electrode 22 (FIG. 22).

Figure 22:
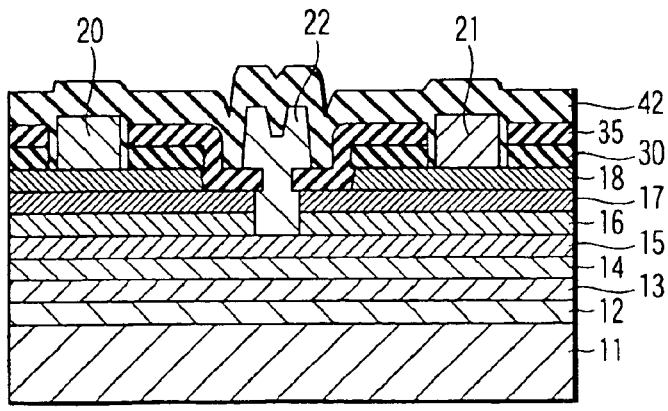
FIG. 22 is a sectional view of the structure of the heterojunction type compound semiconductor field effect transistor shown in FIG. 18, illustrating a fourth manufacturing step of the manufacturing method for this transistor.

Finally, a protective film composed of, for example, SiN is formed all over the surface of the structure to complete a heterojunction type semiconductor field effect transistor (FIG. 22).

Thus, with the manufacturing method according to the present variation, in the first recess etching step for forming the wide recess opening 5, the contact overlayer 18 can be selectively etched by using the $H_3PO_4$-based etchant and accurately controlling the time, temperature, or the like.

Furthermore, in the second recess etching step for forming the narrow recess opening 10, the $H_3PO_4$-based etchant can be used to selectively remove the contact underlayer 17 (GaAs or InGaAs layer), while leaving the electric field strength reducing layer 16 (InGaP layer) as it is. Specifically, since the $H_3PO_4$-based etchant does not substantially etch InGaP, once the surface of the i-$In_{0.49}Ga_{0.51}P$ layer, the electric field strength reducing layer 16, is exposed, the recess etching penetrating the n type contact underlayer 17 can be substantially stopped. This enables the formation of a narrow recess opening 10 with an accurate depth.

As described above, with the manufacturing process according to the present variation, the electric field strength reducing layer 16, composed of an InGaP layer, functions as a stopper during wet etching. This minimizes the electron transmission problem resulting from the use of an InGaP layer. Specifically, the electric field strength reducing layer 16 is intrinsic and thus has a function of relaxing the concentration of electric field that may occur near the end of the gate electrode 22. In the manufacturing process, the electric field strength reducing layer 16 functions as a stopper for etching. Furthermore, during a switching operation, electrons desirably pass through the contact underlayer 17, having as low a resistance value as possible, then through source electrode 20 and the drain electrode 21. Therefore, it is sufficient that the electric field strength reducing layer 16 has a enough thickness to reduce electric fields and function as a stopper as described above. The electric field strength reducing layer 16 can be made thinner than the contact underlayer 17.

[Third Embodiment]

Figure 23:
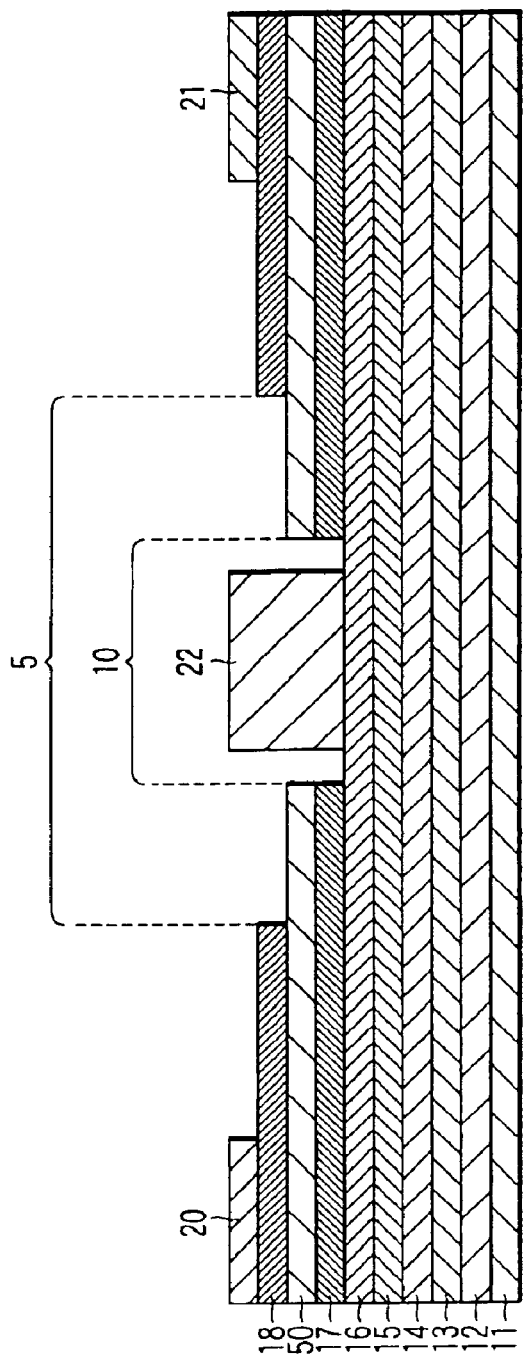
FIG. 23 is a sectional view of the structure of a heterojunction type compound semiconductor field effect transistor according to a third embodiment of the present invention.

FIG. 23 is a schematic sectional view of the structure of a heterojunction type compound semiconductor field effect transistor according to a third embodiment of the present invention. As shown in FIG. 23, an undoped GaAs layer is stacked on the semi-insulating GaAs substrate 11 as the buffer layer 12. Furthermore, the n-$Al_{0.2}Ga_{0.8}As$ layer is stacked on the buffer layer 12 as the lower electron supply layer 13. The i-$Al_{0.2}Ga_{0.8}As$ layer is formed on the electron supply layer 13 as the lower spacer layer (not shown). The i-$In_{0.15}Ga_{0.85}As$ layer is formed on the lower spacer layer as the channel layer 14. The i-$Al_{0.2}Ga_{0.8}As$ layer is formed on the channel layer 14 as the upper spacer layer (not shown). The n-$Al_{0.2}Ga_{0.8}As$ layer is formed on the upper spacer layer as the upper electro supply layer 15. On the electro supply layer 15, the i-$In_{0.48}Ga_{0.52}P$ layer as the electric field strength reducing layer 16, the n-GaAs layer as the contact underlayer 17, the i-$In_{0.49}Ga_{0.51}P$ layer as the recess stopper layer 50, and the low-resistance $n^+$-GaAs layer as the contact overlayer 18 are sequentially stacked.

The wide recess opening 5 is formed in the contact overlayer 18 so as to penetrate this layer 18. The narrow recess opening 10 narrower than the wide recess opening is formed inside the wide recess opening 5 so as to penetrate the contact underlayer-17. That is, the heterojunction type compound semiconductor field effect transistor shown in FIG. 23 has a double recess structure composed of the wide recess opening 5 and the narrow recess opening 10.

Moreover, the gate electrode 22 composed of, for example, Al is formed on the surface of the electric field strength reducing layer 16 exposed from the bottom of the narrow recess opening 10. The source electrode 20 and drain electrode 21, each composed of, for example, AuCe/Ni/Au, are formed on the contact overlayer 18 so as to sandwich the wide recess opening 5 between them.

As described above, the contact underlayer 17, forming the narrow recess opening 10, contains GaAs doped with n type impurities. The contact overlayer 18, forming the wide recess opening 5, also contains GaAs doped with a higher concentration of n type impurities. Moreover, the electric field strength reducing layer 16 is formed of intrinsic InGaP.

Specifically, the field effect transistor according to the third embodiment differs from the second embodiment, shown in FIG. 2, in that the gate electrode 22 is formed on the surface of the electric field strength reducing layer 16 exposed from the bottom of the narrow recess opening 10.

The electric field strength reducing layer 16, composed of InGaP, has a lower carrier trap concentration than the upper electron supply layer 15, composed of n-AlGaAs. Thus, by forming the gate electrode 22 on the surface of the electric field strength reducing layer 16, the reliability and performance of the transistor can be further improved.

Specifically, in general, if carrier traps are present on the surface of a semiconductor layer, they trap electrons or holes as carriers in association with an externally inputted voltage, as suggested by their name. When the carriers are trapped and released, the charged state of the surface varies correspondingly.

Moreover, when a frequency inputted to the gate electrode is high compared to time constants for the trapping and release of carriers, a variation in charged state caused by the trapping and release cannot follow the input frequency. The time constant for the release of electrons is much larger than the time constant for the trapping of electrons. Thus, if the input frequency is high, the electrons simply remain trapped.

As the electrons further remain trapped, a depletion layer on the surface spreads. The channel narrows to reduce the mutual conductance to vary the state of the surface. In this case, the concentration of carrier traps varies depending on the surface state. Therefore, with a particularly high frequency, the surface state varies more markedly to make the carrier trap problem more serious.

Therefore, to provide a high-performance high-frequency semiconductor field effect transistor having improved reliability and performance, it is necessary to stabilize the semiconductor surface to which the gate electrode is connected (carrier traps are not dense).

However, if a high frequency is inputted to the transistor, the surface of the upper electron supply layer 15, composed of n-AlGaAs, is unstably oxidized because it contains Al (carrier traps are dense. Accordingly, if a high frequency is inputted to the gate electrode, improved reliability and performance are obtained by forming the gate electrode on the surface of the electric field strength reducing layer 16, having a more stable surface.

Basic operations are similar to those of the first embodiment. Thus, their detailed description is omitted.

Now, description will be given of a manufacturing method for the heterojunction type compound semiconductor field effect transistor according to the present embodiment.

First, steps similar to those of the first embodiment are executed until the contact overlayer 18 is formed. Then, using an insulating film formed with a pattern used to form the wide recess opening 5, the contact overlayer 18 is wet-etched using an $H_3PO_4$-based etchant composed of, for example, $H_3PO_4$, $H_2O_2$, and $H_2O$ in the ratio of 3:1:50. The wide recess opening 5 is thus formed so as to penetrate the contact overlayer 18. At this time, the $H_3PO_4$-based etchant does not substantially etch InGaP. Accordingly, once the surface of the i-$In_{0.49}Ga_{0.51}P$ layer, the recess stopper layer 50, is exposed, the recess etching of the contact overlayer 18 is substantially stopped.

Then, to form the narrow recess opening 10 narrower than the wide recess opening 5, inside the wide recess opening 5, an insulating film composed of $SiO_2$ is first formed all over the top surface of the structure. Then, a photo resist opening pattern used to form the narrow recess opening 10 is formed on this insulating film. Subsequently, the photo resist opening pattern is used as a mask to etch the insulating film on the basis of the RIE method. A pattern used to form the narrow recess opening is thus formed on the insulating film. Subsequently, the photo resist pattern is released.

Then, the liftoff method is used to form the source electrode 20 and drain electrode 21, each composed of AuGe/Ni/Au, are formed on the surface of the contact overlayer 18 so as to sandwich the wide recess opening 5 between them. Alternatively, the source electrode 20 and the drain electrode 21 may be formed after the formation of the gate electrode 22, described below.

Subsequently, a photo resist pattern is formed, and using the insulating film formed with the pattern used to form the narrow recess opening 10, the recess stopper layer 50 (i-$In_{0.49}Ga_{0.51}P$ layer) is removed using an etchant composed of, for example, an HCl solution. At this time, the HCl solution does not substantially etch the contact underlayer 17, composed of n-GaAs or n-InGaAs.

Then, the narrow recess opening 10 penetrating the contact underlayer 17 is formed using an $H_3PO_4$-based etchant composed of, for example, $H_3PO_4$, $H_2O_2$, and $H_2O$ in the ratio of 3:1:50. At this time, the $H_3PO_4$-based etchant does not substantially etch InGaP.

Accordingly, once the surface of the i-$In_{0.49}Ga_{0.51}P$ layer, the electric field strength reducing layer 16, is exposed, the recess etching penetrating the contact underlayer is substantially stopped.

Then, the gate electrode 22 composed of, for example, Ti/Pt/Au or Ti/Al or Al is formed on the surface of the electric field strength reducing layer 16 exposed from the bottom of the narrow recess opening 10, using, for example, the liftoff method. Alternatively, the gate electrode 22 may be formed of a high-melting-point metal. In this case, the high-melting-point metal is formed into a film using the sputtering method. The film is then patterned using reactive ion etching, to form the gate electrode 22.

Finally, a protective film composed of SiN is formed all over the surface of the structure to complete a heterojunction type semiconductor field effect transistor.

As in the case with the first and second embodiments, in the third embodiment, in the recess etching step for forming the wide recess opening 5, the $H_3PO_4$-based etchant can be used to selectively remove the contact overlayer 18, composed of GaAs, while leaving the recess stopper layer 50, composed of InGaP, as it is. Consequently, the etching depth of the wide recess opening 5 can be accurately controlled.

Furthermore, in the recess etching step for forming the narrow opening inside the wide recess opening 5, the $H_3PO_4$-based etchant can be used to selectively remove the contact underlayer 17, composed of GaAs or InGaAs, while leaving the electric field strength reducing layer 16, composed of InGaP, as it is. Thus, also in this case, the etching depth of the narrow recess opening 10 can be accurately controlled. A decrease in yield can thus be prevented without impairing the advantage of the prior art of being able to accurately control etching in the recess structure. Consequently, with the heterojunction type compound semiconductor field effect transistor according to the present embodiment, it is possible to achieve both high gate withstanding voltage and large maximum drain current while maintaining a high yield. Therefore, if the heterojunction type compound semiconductor field effect transistor according to the present invention is applied to a low-noise amplifier, a linear amplifier, a high-power amplifier, or the like which operates in a microwave or millimeter wave region for which performance such as that described above is required, its performance and yield are expected to be significantly increased.

[Fourth Embodiment]

Figure 24:
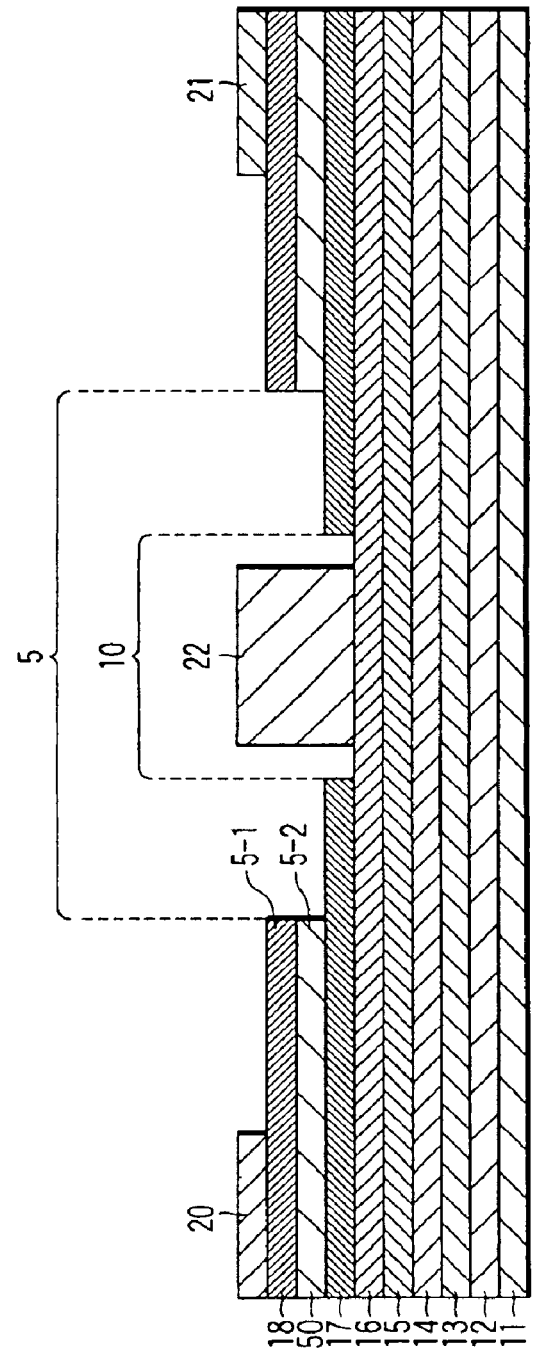
FIG. 24 is a sectional view of the structure of a heterojunction type compound semiconductor field effect transistor according to a fourth embodiment of the present invention.

FIG. 24 is a schematic sectional view of the structure of a heterojunction type compound semiconductor field effect transistor according to a fourth embodiment of the present invention. As shown in FIG. 24, an undoped GaAs layer is stacked on the semi-insulating GaAs substrate 11 as the buffer layer 12. Furthermore, the n-$Al_{0.2}Ga_{0.8}As$ layer is stacked on the buffer layer 12 as the lower electron supply layer 13. The i-$Al_{0.2}Ga_{0.8}As$ layer is formed on the electron supply layer 13 as the lower spacer layer (not shown). The i-$In_{0.15}Ga_{0.85}As$ layer is formed on the lower spacer layer as the channel layer 14. The i-$Al_{0.2}Ga_{0.8}As$ layer is formed on the channel layer 14 as the upper spacer layer (not shown). The n-$Al_{0.2}Ga_{0.8}As$ layer is formed on the upper spacer layer as the upper electro supply layer 15. On the electro supply layer 15, the i-In$_{0.48}$Ga$_{0.52}$P layer as the electric field strength reducing layer 16, the n-GaAs layer as the contact underlayer 17, and the low-resistance n$^+$-GaAs layer as the contact overlayer 18 are sequentially stacked.

The wide recess opening 5 is formed in the contact overlayer 18 so as to penetrate this layer 18. The narrow recess opening 10 narrower than the wide recess opening is formed inside the wide recess opening 5 so as to penetrate the contact underlayer 17. That is, the heterojunction type compound semiconductor field effect transistor shown in FIG. 24 has a double recess structure composed of the wide recess opening 5 and the narrow recess opening 10.

Moreover, the gate electrode 22 composed of, for example, Al is formed on the surface of the electric field strength reducing layer 16 exposed from the bottom of the narrow recess opening 10. The source electrode 20 and drain electrode 21, each composed of, for example, AuCe/Ni/Au, are formed on the contact overlayer 18 so as to sandwich the wide recess opening 5 between them.

As described above, the contact underlayer 17, forming the narrow recess opening 10, contains GaAs doped with n type impurities. The contact overlayer 18, forming the wide recess opening 5, also contains GaAs doped with a higher concentration of n type impurities. Moreover, the electric field strength reducing layer 16 is formed of intrinsic InGaP.

The field effect transistor shown in FIG. 24 differs from the third embodiment in that the wide recess opening 5 is formed in the recess stopper layer 50.

Basic operations are similar to those of the second embodiment. Thus, their detailed description is omitted.

As in the case with the first to third embodiments, in the fourth embodiment, the contact underlayer 17, forming the narrow recess opening 10, contains GaAs doped with n type impurities. The contact overlayer 18, forming the wide recess opening 5, also contains GaAs doped with a higher concentration of n type impurities. Moreover, the electric field strength reducing layer 16 and the recess stopper layer 50 are formed of intrinsic InGaP. This serves to reduce the parasitic resistance and achieve both high gate withstanding voltage and high maximum drain current. Therefore, if the heterojunction type compound semiconductor field effect transistor according to the present embodiment is applied to a low-noise amplifier, a linear amplifier, a high-power amplifier, or the like which operates in a microwave or millimeter wave region for which performance such as that described above is required, its performance and yield are expected to be significantly increased.

Moreover, in the heterojunction type compound semiconductor field effect transistor according to the present embodiment, the electric field strength reducing layer 16, composed of InGaP, is exposed from the bottom of the narrow recess opening 10. In contrast, in the conventional heterojunction type compound semiconductor field effect transistor shown in FIG. 1, the semiconductor electron supply layer 115, composed of AlGaAs, is exposed from the bottom of the narrow recess opening 10.

Furthermore, for a reason similar to that in the third embodiment, the gate electrode 22 is connected to the surface of the electric field strength reducing layer 16, having a low carrier trap concentration. Accordingly, improved reliability and performance can be achieved compared to the conventional heterojunction type compound semiconductor field effect transistor shown in FIG. 1.

Now, description will be given of a manufacturing method for the heterojunction type compound semiconductor field effect transistor according to the present embodiment. First, steps similar to those of the second and third embodiments are executed until the contact overlayer 18 is formed. Then, using an insulating film formed with a pattern used to form the wide recess opening 5, the contact overlayer 18 is wet-etched using an H$_3$PO$_4$-based etchant composed of, for example, H$_3$PO$_4$, H$_2$O$_2$, and H$_2$O in the ratio of 3:1:50. A wide recess opening 5-1 is thus formed so as to penetrate the contact overlayer 18. At this time, the H$_3$PO$_4$-based etchant does not substantially etch InGaP. Accordingly, once the surface of the i-In$_{0.49}$Ga$_{0.51}$P layer, the recess stopper layer 50, is exposed, the recess etching of the contact overlayer 18 is substantially stopped.

Subsequently, using the insulating film as a mask as well as an etchant composed of, for example, HCl, an opening 5-2 is formed which penetrates the recess stopper layer 50 and which reaches the surface of the contact underlayer 17. At this time, HCl does not substantially etch the contact underlayer 17, composed of n-GaAs. Accordingly, once the surface of the contact underlayer 17 is exposed, the recess etching is substantially stopped.

Then, to form the narrow recess opening 10 narrower than the wide recess opening 5, inside the wide recess opening 5, an insulating film composed of SiO$_2$ is first formed all over the top surface of the structure. Then, a photo resist opening pattern used to form the narrow recess opening 10 is formed on this insulating film. Subsequently, the photo resist opening pattern is used as a mask to etch the insulating film on the basis of the RIE method. A pattern used to form the narrow recess opening 10 is thus formed on the insulating film. Subsequently, the photo resist pattern is released.

Then, the liftoff method is used to form the source electrode 20 and drain electrode 21, each composed of AuGe/Ni/Au, are formed on the surface of the contact overlayer 18 so as to sandwich the wide recess opening 5 between them. Alternatively, the source electrode 20 and the drain electrode 21 may be formed after the formation of the gate electrode 22, described below.

Subsequently, the narrow recess opening 10 penetrating the contact underlayer 17 is formed using an H$_3$PO$_4$-based etchant composed of, for example, H$_3$PO$_4$, H$_2$O$_2$, and H$_2$O in the ratio of 3:1:50. At this time, the H$_3$PO$_4$-based etchant does not substantially etch InGaP. Accordingly, once the surface of the i-In$_{0.49}$Ga$_{0.51}$P layer, the electric field strength reducing layer 16, is exposed, the recess etching penetrating the contact underlayer is substantially stopped.

Then, the gate electrode 22 composed of, for example, Ti/Pt/Au or Ti/Al or Al is formed on the surface of the electric field strength reducing layer 16 exposed from the bottom of the narrow recess opening 10, using, for example, the liftoff method. Alternatively, the gate electrode 22 may be formed of a high-melting-point metal. In this case, the high-melting-point metal is formed into a film using the sputtering method. The film is then patterned using reactive ion etching, to form the gate electrode 22.

Finally, a protective film composed of SiN is formed all over the surface of the structure to complete a heterojunction type semiconductor field effect transistor.

As in the previously described embodiments, in the fourth embodiment, a recess etching process is executed to form a double recess structure. In the recess etching step for forming the wide recess opening 5, the H$_3$PO$_4$-based etchant can be used to selectively remove the contact overlayer 18, composed of GaAs, while leaving the recess stopper layer 50, composed of InGaP, as it is. Consequently, the etching depth can be accurately controlled. Furthermore, in the recess etching step for forming the narrow recess opening 10 inside the wide recess opening 5, the H$_3$PO$_4$-based etchant can be used to selectively remove the contact underlayer 17, composed of GaAs or InGaAs, while leaving the electric field strength reducing layer 16, composed of InGaP, as it is. Thus, also in this case, the etching depth can be accurately controlled. Consequently, with the heterojunction type compound semiconductor field effect transistor according to the present invention, it is possible to achieve both high gate withstanding voltage and large maximum drain current while maintaining a high yield. Therefore, if the heterojunction type compound semiconductor field effect transistor according to the present embodiment is applied to a low-noise amplifier, a linear amplifier, a high-power amplifier, or the like which operates in a microwave or millimeter wave region for which performance such as that described above is required, its performance and yield are expected to be significantly increased.

In the heterojunction type compound semiconductor field effect transistor according to the present embodiment, the GaAs contact underlayer 17 or the InGaAs contact underlayer 17 is exposed from the bottom of the wide recess opening 5. This prevents the failure to form the narrow recess opening 10 as occurs in the prior art. As a result, the yield can be increased.

Furthermore, as in the case with the second embodiment, the recess stopper layer 50 can be made thinner than the contact underlayer 17.

[Variation 2]

Figure 25:
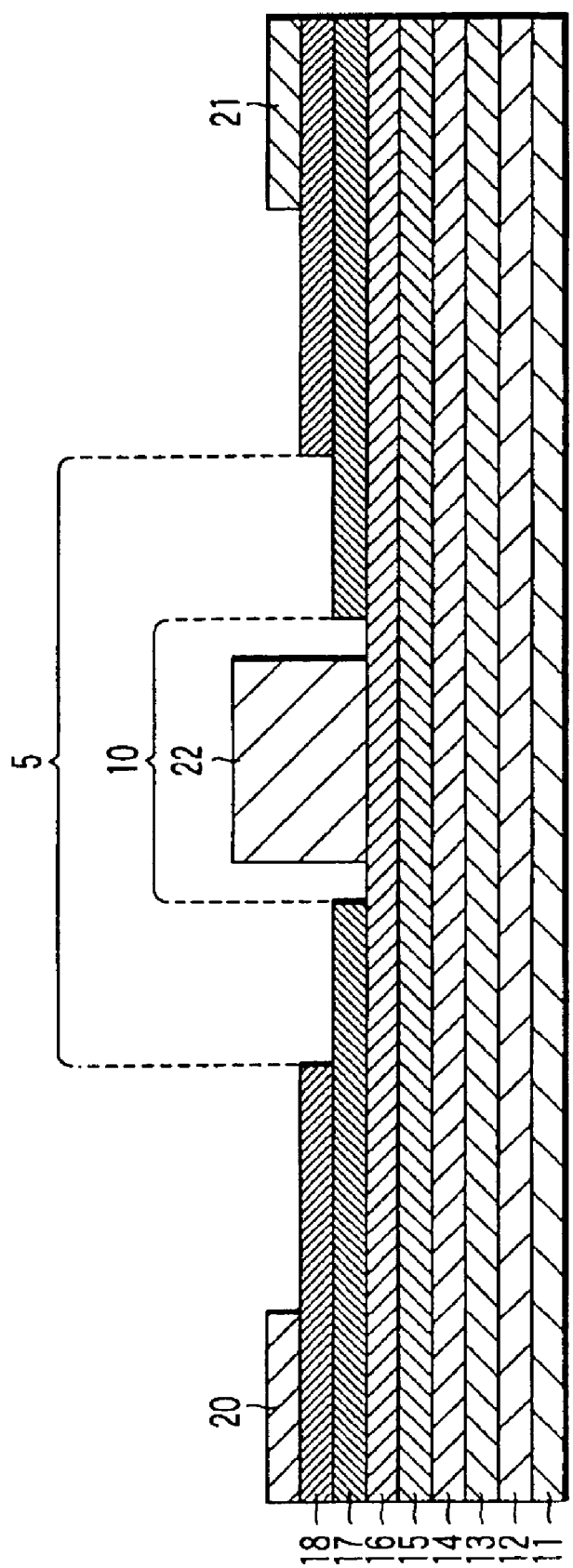
FIG. 25 is a sectional view of the structure of a variation of the heterojunction type compound semiconductor field effect transistors according to the third and fourth embodiments of the present invention.

FIG. 25 is a sectional view of the structure of a variation of the heterojunction type compound semiconductor field effect transistors according to the fourth embodiment of the present invention. As shown in FIG. 25, an undoped GaAs layer is stacked on the semi-insulating GaAs substrate 11 as the buffer layer 12. Furthermore, the n-$Al_{0.2}Ga_{0.8}As$ layer is stacked on the buffer layer 12 as the lower electron supply layer 13. The i-$Al_{0.2}Ga_{0.8}As$ layer is formed on the electron supply layer 13 as the lower spacer layer (not shown). The i-$In_{0.15}Ga_{0.85}As$ layer is formed on the lower spacer layer as the channel layer 14. The i-$Al_{0.2}Ga_{0.8}As$ layer is formed on the channel layer 14 as the upper spacer layer (not shown). The n-$Al_{0.2}Ga_{0.8}As$ layer is formed on the upper spacer layer as the upper electro supply layer 15. On the electro supply layer 15, the i-$In_{0.48}Ga_{0.52}P$ layer as the electric field strength reducing layer 16, the n-GaAs layer as the contact underlayer 17, and the low-resistance $n^+$-GaAs layer as the contact overlayer 18 are sequentially stacked.

The wide recess opening 5 is formed in the contact overlayer 18 so as to penetrate this layer 18. The narrow recess opening 10 narrower than the wide recess opening is formed inside the wide recess opening 5 so as to penetrate the contact underlayer 17. That is, the heterojunction type compound semiconductor field effect transistor shown in FIG. 25 has a double recess structure composed of the wide recess opening 5 and the narrow recess opening 10.

Moreover, the gate electrode 22 composed of, for example, Al is formed on the surface of the electric field strength reducing layer 16 exposed from the bottom-of the narrow recess opening 10. The source electrode 20 and drain electrode 21, each composed of, for example, AuCe/Ni/Au, are formed on the contact overlayer 18 so as to sandwich the wide recess opening 5 between them.

As described above, the contact underlayer 17, forming the narrow recess opening 10, contains GaAs doped with n type impurities. The contact overlayer 18, forming the wide recess opening 5, also contains GaAs doped with a higher concentration of n type impurities. Moreover, the electric field strength reducing layer 16 is formed of intrinsic InGaP.

The present embodiment differs from Variation 1 in that the gate electrode 22 is formed on the surface of the electric field strength reducing layer 16 exposed from the bottom of the narrow recess opening 10.

Accordingly, for a reason similar to that in the third embodiment, the gate electrode 22 is connected to the surface of the electric field strength reducing layer 16, having a low carrier trap concentration. Improved reliability and performance can thus be achieved compared to the conventional heterojunction type compound semiconductor field effect transistor shown in FIG. 1.

Basic operations are similar to those of Variation 1, and their detailed description is thus omitted.

Basically, this method first executes steps similar to those shown in FIGS. 3 to 10. However, this method differs from the first embodiment in that when the wide recess opening 5 is formed in the contact overlayer 18 in the steps shown in FIGS. 5 and 6, an etching operation must be accurately preformed by using an $H_3PO_4$-based etchant and controlling time, temperature, or the like.

Subsequently, steps such as those shown in FIGS. 7 to 10 are executed to obtain an intermediate structure such as that shown in FIG. 10.

Then, using an insulating film formed with a pattern used to form the narrow recess opening 10, the contact underlayer 17 is wet-etched using an $H_3PO_4$-based etchant composed of, for example, $H_3PO_4$, $H_2O_2$, and $H_2O$ in the ratio of 3:1:50. The narrow recess opening 10 is thus formed so as to penetrate the contact underlayer 17. At this time, the $H_3PO_4$-based etchant does not substantially etch InGaP. Accordingly, once the surface of the i-$In_{0.48}Ga_{0.52}P$ layer, the electric field strength reducing layer 16, is exposed, the recess etching penetrating the contact underlayer 17 is substantially stopped.

Then, the gate electrode 22 composed of, for example, Ti/Pt/Au or Ti/Al or Al is formed on the surface of the upper electron supply layer 15 exposed from the bottom of the narrow recess opening 10, using, for example, the liftoff method. Alternatively, the gate electrode 22 may be formed of a high-melting-point metal.

Finally, the protective film 42 composed of, for example, SiN is formed all over the surface of the structure to complete a heterojunction type semiconductor field effect transistor.

As described above, in the step of forming the narrow recess opening 10, the $H_3PO_4$-based etchant etches the i-$In_{0.48}Ga_{0.52}P$ layer, the electric field strength reducing layer 16, very slowly. Thus, once the surface of the electric field strength reducing layer 16 is exposed, the recess etching penetrating the n type contact underlayer 17 is substantially stopped. Accordingly, the electric field strength reducing layer 16 is effective in reducing electric fields that may be generated near the gate electrode 22, and also functions as an etching stopper during the manufacturing process. This enables a high etching accuracy to be maintained during the manufacturing process, thus making use of the advantages of the double recess structure.

Moreover, compared to the first embodiment, it is possible to omit the step of etching the electric field strength reducing layer 16. Manufacturing costs can thus be reduced.

In the above embodiments, the InGaP layer cannot be replaced with the AlGaAs layer. A dry etching technique using a gas containing a F (fluorine)-based gas is known to be able to appropriately etch the GaAs or InGaAs layer so that the selection ratio of the GaAs or InGaAs layer to the AlGaAs layer is high. This technique appears to produce similar effects by substituting the AlGaAs layer for the InGaP layer. However, this is difficult for the reasons described below.

First, the dry etching technique unavoidably causes defects in a substrate which may degrade the characteristics of the transistor.

Second, AlGaAs has a lower electron affinity than InGaP. AlGaAs thus creates a large energy discontinuous area in a conduction band in an AlGaAs/GaAs interface or an AlGaAs/InGaAs interface. Accordingly, when electrons flow from the GaAs or InGaAs layer to the AlGaAs layer, they must pass over an energy barrier of, for example, about 300 mV. This may increase a contact resistance.

In contrast, according to the manufacturing method of each embodiment of the present invention, the recess etching comprises wet etching. This prevents defects in the substrate which may degrade the characteristics of the transistor. Furthermore, InGaP has a relatively high electron affinity. InGaP thus creates only a small energy discontinuous area in a conduction band in an InGaP/GaAs interface or an InGaP/InGaAs interface. Accordingly, when electrons flow from the GaAs or InGaAs layer to the GaAsP layer, they have only to pass over an energy barrier of, for example, about 30 mV or less. This suppresses an increase in contact resistance.

In the above embodiments, the lower electron supply layer 13 and upper electron supply layer 15, each composed of n-AlGaAs, need not contain a uniform amount of n type impurities. These layers may locally contain a higher concentration of type impurities. That is, the lower electron supply layer 13 and the upper electron supply layer 15 may be formed of AlGaAs partly or entirely doped with n type impurities.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A heterojunction type compound semiconductor field effect transistor comprising:
   a channel layer provided on a compound semiconductor substrate and composed of intrinsic GaAs or InGaAs;
   a first electron supply layer provided on the channel layer and composed of AlGaAs doped with n type impurities;
   an electric field strength reducing layer provided on the first electron supply layer and composed of intrinsic InGaP;
   a first contact layer provided on the electric field strength reducing layer and composed of GaAs or InGaAs doped with n type impurities;
   a recess stopper layer provided on the first contact layer and composed of intrinsic InGaP;
   a second contact layer provided on the recess stopper layer and composed of GaAs doped with n type impurities of a concentration higher than that of the first contact layer;
   a wide recess opening formed to penetrate the second contact layer so as to expose a surface of the recess stopper layer;
   a narrow recess opening formed in the wide recess opening to penetrate the recess stopper layer, the first contact layer, and the electric field strength reducing layer so as to expose a surface of the first electron supply layer;
   a gate electrode provided on the surface of the first electron supply layer exposed from a bottom of the narrow recess opening; and
   a source electrode and a drain electrode provided on the second contact layer outside the wide recess opening so that the wide recess opening is sandwiched between the source electrode and the drain electrode.

2. The heterojunction type compound semiconductor field effect transistor according to claim 1, wherein each of the electric field strength reducing layer and the recess stopper layer is thinner than the first contact layer.

3. The heterojunction type compound semiconductor field effect transistor according to claim 1, wherein the compound semiconductor substrate includes a semi-insulating GaAs substrate, a buffer layer provided on the semi-insulating GaAs substrate and having a superlattice structure, and a second electron supply layer provided on the buffer layer and under the channel layer and composed of AlGaAs doped with n type impurities.

4. A heterojunction type compound semiconductor field effect transistor comprising:
   a channel layer provided on a compound semiconductor substrate and composed of intrinsic GaAs or InGaAs;
   a first electron supply layer provided on the channel layer and composed of AlGaAs doped with n type impurities;
   an electric field strength reducing layer provided on the first electron supply layer and composed of intrinsic InGaP;
   a first contact layer provided on the electric field strength reducing layer and composed of GaAs or InGaAs doped with n type impurities;
   a recess stopper layer provided on the first contact layer and composed of intrinsic InGaP;
   a second contact layer provided on the recess stopper layer and composed of GaAs doped with n type impurities of a concentration higher than that of the first contact layer;
   a wide recess opening formed to penetrate the second contact layer and the recess stopper layer so as to expose a surface of the first contact layer;
   a narrow recess opening formed in the wide recess opening to penetrate the first contact layer and the electric field strength reducing layer so as to expose a surface of the first electron supply layer;
   a gate electrode provided on the surface of the first electron supply layer exposed from a bottom of the narrow recess opening; and
   a source electrode and a drain electrode provided on the second contact layer outside the wide recess opening so that the wide recess opening is sandwiched between the source electrode and the drain electrode.

5. The heterojunction type compound semiconductor field effect transistor according to claim 4, wherein each of the electric field strength reducing layer and the recess stopper layer is thinner than the first contact layer.

6. The heterojunction type compound semiconductor field effect transistor according to claim 4, wherein the compound semiconductor substrate includes a semi-insulating GaAs substrate, a buffer layer provided on the semi-insulating GaAs substrate and having a superlattice structure, and a second electron-supply layer provided on the buffer layer and under the channel layer and composed of AlGaAs doped with n type impurities.

7. A heterojunction type compound semiconductor field effect transistor comprising:
   a channel layer provided on a compound semiconductor substrate and composed of intrinsic GaAs or InGaAs;
   a first electron supply layer provided on the channel layer and composed of AlGaAs doped with n type impurities;

an electric field strength reducing layer provided on the first electron supply layer and composed of intrinsic InGaP;

a first contact layer provided on the electric field strength reducing layer and composed of GaAs or InGaAs doped with n type impurities;

a recess stopper layer provided on the first contact layer and composed of intrinsic InGaP;

a second contact layer provided on the recess stopper layer and composed of GaAs doped with n type impurities of a concentration higher than that of the first contact layer;

a wide recess opening formed to penetrate the second contact layer so as to expose a surface of the recess stopper layer;

a narrow recess opening formed in the wide recess opening to penetrate the recess stopper layer and the first contact layer so as to expose a surface of the electric field strength reducing layer;

a gate electrode provided on the surface of the electric field strength reducing layer exposed from a bottom of the narrow recess opening; and a source electrode and a drain electrode provided on the second contact layer outside the wide recess opening so that the wide recess opening is sandwiched between the source electrode and the drain electrode.

8. The heterojunction type compound semiconductor field effect transistor according to claim 7, wherein each of the electric field strength reducing layer and the recess stopper layer is thinner than the first contact layer.

9. The heterojunction type compound semiconductor field effect transistor according to claim 7, wherein the compound semiconductor substrate includes a semi-insulating GaAs substrate, a buffer layer provided on the semi-insulating GaAs substrate and having a superlattice structure, and a second electron supply layer provided on the buffer layer and under the channel layer and composed of AlGaAs doped with n type impurities.

10. A heterojunction type compound semiconductor field effect transistor comprising:

a channel layer provided on a compound semiconductor substrate and composed of intrinsic GaAs or InGaAs;

a first electron supply layer provided on the channel layer and composed of AlGaAs doped with n type impurities;

an electric field strength reducing layer provided on the first electron supply layer and composed of intrinsic InGaP;

a first contact layer provided on the electric field strength reducing layer and composed of GaAs or InGaAs doped with n type impurities;

a recess stopper layer provided on the first contact layer and composed of intrinsic InGaP;

a second contact layer provided on the recess stopper layer and composed of GaAs doped with n type impurities of a concentration higher than that of the first contact layer;

a wide recess opening formed to penetrate the second contact layer and the recess stopper layer so as to expose-a surface of the first contact layer;

a narrow recess opening formed in the wide recess opening to penetrate the first contact layer so as to expose a surface of the electric field strength reducing layer;

a gate electrode provided on the surface of the electric field strength reducing layer exposed from a bottom of the narrow recess opening; and a source electrode and a drain electrode provided on the second contact layer outside the wide recess opening so that the wide recess opening is sandwiched between the source electrode and the drain electrode.

11. The heterojunction type compound semiconductor field effect transistor according to claim 10, wherein each of the electric field strength reducing layer and the recess stopper layer is thinner than the first contact layer.

12. The heterojunction type compound semiconductor field effect transistor according to claim 10, wherein the compound semiconductor substrate includes a semi-insulating GaAs substrate, a buffer layer provided on the semi-insulating GaAs substrate and having a superlattice structure, and a second electron supply layer provided on the buffer layer and under the channel layer and composed of AlGaAs doped with n type impurities.

* * * * *